United States Patent
Lee

(10) Patent No.: US 10,274,760 B2
(45) Date of Patent: Apr. 30, 2019

(54) DIVISIONAL EXPOSURE APPARATUS AND METHOD OF MANUFACTURING LIQUID CRYSTAL DISPLAY USING THE SAME

(71) Applicant: LG Display Co., Ltd., Seoul (KR)

(72) Inventor: Donghyun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 30 days.

(21) Appl. No.: 15/499,678

(22) Filed: Apr. 27, 2017

(65) Prior Publication Data
US 2017/0315451 A1    Nov. 2, 2017

(30) Foreign Application Priority Data
Apr. 28, 2016    (KR) .................. 10-2016-0052410

(51) Int. Cl.
*G02F 1/13* (2006.01)
*G03F 7/20* (2006.01)
*G02F 1/1368* (2006.01)
*G02F 1/1362* (2006.01)

(52) U.S. Cl.
CPC .......... *G02F 1/1303* (2013.01); *G02F 1/1368* (2013.01); *G03F 7/70083* (2013.01); *G02F 2001/136222* (2013.01); *G02F 2001/136236* (2013.01)

(58) Field of Classification Search
None
See application file for complete search history.

(56) References Cited

U.S. PATENT DOCUMENTS

| 5,285,236 A | 2/1994 | Jain |
| 6,333,138 B1 | 12/2001 | Higashikawa et al. |
| 2001/0018153 A1* | 8/2001 | Irie .................... G03F 7/70066 430/5 |
| 2015/0242563 A1 | 8/2015 | Wieland |

FOREIGN PATENT DOCUMENTS

| CN | 1419266 A | 5/2003 |
| CN | 1979344 A | 6/2007 |
| JP | 2001-060546 A | 3/2001 |
| JP | 2001-100652 A | 4/2001 |
| JP | 2001-297975 A | 10/2001 |
| JP | 2003-151880 A | 5/2003 |
| JP | 2005-284291 A | 10/2005 |

(Continued)

OTHER PUBLICATIONS

Office Action dated Apr. 24, 2018 for a counterpart Chinese patent application No. 201710287905.5.

*Primary Examiner* — Michelle M Iacoletti
(74) *Attorney, Agent, or Firm* — Polsinelli PC

(57) ABSTRACT

Disclosed are a divisional exposure apparatus which allows for forming a PAC layer uniformly on RGBW subpixels by a single mask process, using divisional exposure, in a large-size liquid crystal display with a COT structure, and a method of manufacturing a liquid crystal display using the same. To this end, the sum of illumination intensities at the center of an overlap region is controlled in the range of 120% to 130%, and gradually increases from 100% at the edge (boundary) of the overlap region. Accordingly, the cell gap between the RGB subpixels and the W subpixel is made uniform, thus preventing the problem of spots.

19 Claims, 19 Drawing Sheets

(56) References Cited

FOREIGN PATENT DOCUMENTS

| | | |
|---|---|---|
| JP | 2012-022194 A | 2/2012 |
| JP | 2014-066954 A | 4/2014 |
| JP | 2014-192255 A | 10/2014 |
| JP | 2017-506435 A | 3/2017 |
| WO | 2015/124613 A1 | 8/2015 |

* cited by examiner

FIG. 9

| POSITION | L | R | SUM |
|---|---|---|---|
| 1 | 0% | 100% | 100% |
| 2 | 1% | 99% | 100% |
| 3 | 4% | 98% | 102% |
| 4 | 7% | 97% | 104% |
| 5 | 10% | 96% | 106% |
| 6 | 13% | 95% | 108% |
| 7 | 16% | 94% | 110% |
| 8 | 19% | 93% | 112% |
| 9 | 22% | 92% | 114% |
| 10 | 25% | 91% | 116% |
| 11 | 28% | 90% | 118% |
| 12 | 31% | 89% | 120% |
| 13 | 32% | 88% | 120% |
| 14 | 33% | 87% | 120% |
| 15 | 34% | 86% | 120% |
| 16 | 35% | 85% | 120% |
| 17 | 36% | 84% | 120% |
| 18 | 37% | 83% | 120% |
| 19 | 38% | 82% | 120% |
| 20 | 39% | 81% | 120% |
| 21 | 40% | 80% | 120% |
| 22 | 41% | 79% | 120% |
| 23 | 42% | 78% | 120% |
| 24 | 43% | 77% | 120% |
| 25 | 44% | 76% | 120% |
| 26 | 45% | 75% | 120% |
| 27 | 46% | 74% | 120% |
| 28 | 47% | 73% | 120% |
| 29 | 48% | 72% | 120% |
| 30 | 49% | 71% | 120% |
| 31 | 50% | 70% | 120% |
| 32 | 51% | 69% | 120% |
| 33 | 52% | 68% | 120% |
| 34 | 53% | 67% | 120% |
| 35 | 54% | 66% | 120% |
| 36 | 55% | 65% | 120% |
| 37 | 56% | 64% | 120% |
| 38 | 57% | 63% | 120% |
| 39 | 58% | 62% | 120% |
| 40 | 59% | 61% | 120% |
| 41 | 60% | 60% | 120% |
| 42 | 61% | 59% | 120% |
| 43 | 62% | 58% | 120% |
| 44 | 63% | 57% | 120% |
| 45 | 64% | 56% | 120% |
| 46 | 65% | 55% | 120% |
| 47 | 66% | 54% | 120% |
| 48 | 67% | 53% | 120% |
| 49 | 68% | 52% | 120% |
| 50 | 69% | 51% | 120% |
| 51 | 70% | 50% | 120% |
| 52 | 71% | 49% | 120% |
| 53 | 72% | 48% | 120% |
| 54 | 73% | 47% | 120% |
| 55 | 74% | 46% | 120% |
| 56 | 75% | 45% | 120% |
| 57 | 76% | 44% | 120% |
| 58 | 77% | 43% | 120% |
| 59 | 78% | 42% | 120% |
| 60 | 79% | 41% | 120% |
| 61 | 80% | 40% | 120% |
| 62 | 81% | 39% | 120% |
| 63 | 82% | 38% | 120% |
| 64 | 83% | 37% | 120% |
| 65 | 84% | 36% | 120% |
| 66 | 85% | 35% | 120% |
| 67 | 86% | 34% | 120% |
| 68 | 87% | 33% | 120% |
| 69 | 88% | 32% | 120% |
| 70 | 89% | 31% | 120% |
| 71 | 90% | 28% | 118% |
| 72 | 91% | 25% | 116% |
| 73 | 92% | 22% | 114% |
| 74 | 93% | 19% | 112% |
| 75 | 94% | 16% | 110% |
| 76 | 95% | 13% | 108% |
| 77 | 96% | 10% | 106% |
| 78 | 97% | 7% | 104% |
| 79 | 98% | 4% | 102% |
| 80 | 99% | 1% | 100% |
| 81 | 100% | 0% | 100% |

FIG. 13

| POSITION | L | R | SUM |
|---|---|---|---|
| 1 | 0.0% | 100.0% | 100.0% |
| 2 | 1.0% | 99.0% | 100.0% |
| 3 | 2.0% | 98.0% | 100.0% |
| 4 | 3.5% | 97.0% | 100.5% |
| 5 | 5.5% | 96.0% | 101.5% |
| 6 | 7.5% | 95.0% | 102.5% |
| 7 | 9.5% | 94.0% | 103.5% |
| 8 | 11.5% | 93.0% | 104.5% |
| 9 | 13.5% | 92.0% | 105.5% |
| 10 | 15.5% | 91.0% | 106.5% |
| 11 | 18.0% | 90.0% | 108.0% |
| 12 | 20.5% | 89.0% | 109.5% |
| 13 | 23.5% | 88.0% | 111.5% |
| 14 | 26.0% | 87.0% | 113.0% |
| 15 | 28.5% | 86.0% | 114.5% |
| 16 | 30.5% | 85.0% | 115.5% |
| 17 | 32.5% | 84.0% | 116.5% |
| 18 | 34.5% | 83.0% | 117.5% |
| 19 | 36.5% | 82.0% | 118.5% |
| 20 | 38.5% | 81.0% | 119.5% |
| 21 | 40.0% | 80.0% | 120.0% |
| 22 | 41.0% | 79.0% | 120.0% |
| 23 | 42.0% | 78.0% | 120.0% |
| 24 | 43.0% | 77.0% | 120.0% |
| 25 | 44.0% | 76.0% | 120.0% |
| 26 | 45.0% | 75.0% | 120.0% |
| 27 | 46.0% | 74.0% | 120.0% |
| 28 | 47.0% | 73.0% | 120.0% |
| 29 | 48.0% | 72.0% | 120.0% |
| 30 | 49.0% | 71.0% | 120.0% |
| 31 | 50.0% | 70.0% | 120.0% |
| 32 | 51.0% | 69.0% | 120.0% |
| 33 | 52.0% | 68.0% | 120.0% |
| 34 | 53.0% | 67.0% | 120.0% |
| 35 | 54.0% | 66.0% | 120.0% |
| 36 | 55.0% | 65.0% | 120.0% |
| 37 | 56.0% | 64.0% | 120.0% |
| 38 | 57.0% | 63.0% | 120.0% |
| 39 | 58.0% | 62.0% | 120.0% |
| 40 | 59.0% | 61.0% | 120.0% |
| 41 | 60.0% | 60.0% | 120.0% |
| 42 | 61.0% | 59.0% | 120.0% |
| 43 | 62.0% | 58.0% | 120.0% |
| 44 | 63.0% | 57.0% | 120.0% |
| 45 | 64.0% | 56.0% | 120.0% |
| 46 | 65.0% | 55.0% | 120.0% |
| 47 | 66.0% | 54.0% | 120.0% |
| 48 | 67.0% | 53.0% | 120.0% |
| 49 | 68.0% | 52.0% | 120.0% |
| 50 | 69.0% | 51.0% | 120.0% |
| 51 | 70.0% | 50.0% | 120.0% |
| 52 | 71.0% | 49.0% | 120.0% |
| 53 | 72.0% | 48.0% | 120.0% |
| 54 | 73.0% | 47.0% | 120.0% |
| 55 | 74.0% | 46.0% | 120.0% |
| 56 | 75.0% | 45.0% | 120.0% |
| 57 | 76.0% | 44.0% | 120.0% |
| 58 | 77.0% | 43.0% | 120.0% |
| 59 | 78.0% | 42.0% | 120.0% |
| 60 | 79.0% | 41.0% | 120.0% |
| 61 | 80.0% | 40.0% | 120.0% |
| 62 | 81.0% | 38.5% | 119.5% |
| 63 | 82.0% | 36.5% | 118.5% |
| 64 | 83.0% | 34.5% | 117.5% |
| 65 | 84.0% | 32.5% | 116.5% |
| 66 | 85.0% | 30.5% | 115.5% |
| 67 | 86.0% | 28.5% | 114.5% |
| 68 | 87.0% | 26.0% | 113.5% |
| 69 | 88.0% | 23.5% | 111.5% |
| 70 | 89.0% | 20.5% | 109.5% |
| 71 | 90.0% | 18.0% | 108.5% |
| 72 | 91.0% | 15.5% | 106.5% |
| 73 | 92.0% | 13.5% | 105.5% |
| 74 | 93.0% | 11.5% | 104.5% |
| 75 | 94.0% | 9.5% | 103.5% |
| 76 | 95.0% | 7.5% | 102.5% |
| 77 | 96.0% | 5.5% | 101.5% |
| 78 | 97.0% | 3.5% | 100.5% |
| 79 | 98.0% | 2.0% | 100.0% |
| 80 | 99.0% | 1.0% | 100.0% |
| 81 | 100.0% | 0.0% | 100.0% |

FIG. 16

| POSITION | L | R | SUM |
|---|---|---|---|
| 1 | 0.0% | 100.0% | 100.0% |
| 2 | 1.0% | 99.5% | 100.5% |
| 3 | 2.0% | 99.0% | 101.0% |
| 4 | 3.0% | 98.5% | 101.5% |
| 5 | 4.0% | 98.0% | 102.0% |
| 6 | 5.0% | 97.5% | 102.5% |
| 7 | 6.0% | 97.0% | 103.0% |
| 8 | 7.0% | 96.5% | 103.5% |
| 9 | 8.0% | 96.0% | 104.0% |
| 10 | 9.0% | 95.5% | 104.5% |
| 11 | 10.0% | 95.0% | 105.0% |
| 12 | 11.5% | 94.5% | 106.0% |
| 13 | 13.0% | 94.0% | 107.0% |
| 14 | 14.5% | 93.5% | 108.0% |
| 15 | 16.0% | 93.0% | 109.0% |
| 16 | 17.5% | 92.5% | 110.0% |
| 17 | 19.0% | 92.0% | 111.0% |
| 18 | 20.5% | 91.5% | 112.0% |
| 19 | 22.0% | 91.0% | 113.0% |
| 20 | 23.5% | 90.5% | 114.0% |
| 21 | 25.0% | 90.0% | 115.0% |
| 22 | 26.5% | 89.0% | 115.5% |
| 23 | 28.0% | 88.0% | 116.0% |
| 24 | 29.5% | 87.0% | 116.5% |
| 25 | 31.0% | 86.0% | 117.0% |
| 26 | 32.5% | 85.0% | 117.5% |
| 27 | 34.0% | 84.0% | 118.0% |
| 28 | 35.5% | 83.0% | 118.5% |
| 29 | 37.0% | 82.0% | 119.0% |
| 30 | 38.5% | 81.0% | 119.5% |
| 31 | 40.0% | 80.0% | 120.0% |
| 32 | 41.0% | 79.0% | 120.0% |
| 33 | 42.0% | 78.0% | 120.0% |
| 34 | 43.0% | 77.0% | 120.0% |
| 35 | 44.0% | 76.0% | 120.0% |
| 36 | 45.0% | 75.0% | 120.0% |
| 37 | 46.0% | 74.0% | 120.0% |
| 38 | 47.0% | 73.0% | 120.0% |
| 39 | 48.0% | 72.0% | 120.0% |
| 40 | 49.0% | 71.0% | 120.0% |
| 41 | 50.0% | 70.0% | 120.0% |
| 42 | 51.0% | 69.0% | 120.0% |
| 43 | 52.0% | 68.0% | 120.0% |
| 44 | 53.0% | 67.0% | 120.0% |
| 45 | 54.0% | 66.0% | 120.0% |
| 46 | 55.0% | 65.0% | 120.0% |
| 47 | 56.0% | 64.0% | 120.0% |
| 48 | 57.0% | 63.0% | 120.0% |
| 49 | 58.0% | 62.0% | 120.0% |
| 50 | 59.0% | 61.0% | 120.0% |
| 51 | 60.0% | 60.0% | 120.0% |
| 52 | 61.0% | 59.0% | 120.0% |
| 53 | 62.0% | 58.0% | 120.0% |
| 54 | 63.0% | 57.0% | 120.0% |
| 55 | 64.0% | 56.0% | 120.0% |
| 56 | 65.0% | 55.0% | 120.0% |
| 57 | 66.0% | 54.0% | 120.0% |
| 58 | 67.0% | 53.0% | 120.0% |
| 59 | 68.0% | 52.0% | 120.0% |
| 60 | 69.0% | 51.0% | 120.0% |
| 61 | 70.0% | 50.0% | 120.0% |
| 62 | 71.0% | 49.0% | 120.0% |
| 63 | 72.0% | 48.0% | 120.0% |
| 64 | 73.0% | 47.0% | 120.0% |
| 65 | 74.0% | 46.0% | 120.0% |
| 66 | 75.0% | 45.0% | 120.0% |
| 67 | 76.0% | 44.0% | 120.0% |
| 68 | 77.0% | 43.0% | 120.0% |
| 69 | 78.0% | 42.0% | 120.0% |
| 70 | 79.0% | 41.0% | 120.0% |
| 71 | 80.0% | 40.0% | 120.0% |
| 72 | 81.0% | 38.5% | 119.5% |
| 73 | 82.0% | 37.0% | 119.0% |
| 74 | 83.0% | 35.5% | 118.5% |
| 75 | 84.0% | 34.0% | 118.0% |
| 76 | 85.0% | 32.5% | 117.5% |
| 77 | 86.0% | 31.0% | 117.0% |
| 78 | 87.0% | 29.5% | 116.5% |
| 79 | 88.0% | 28.0% | 116.0% |
| 80 | 89.0% | 26.5% | 115.5% |
| 81 | 90.0% | 25.0% | 115.0% |
| 82 | 90.5% | 23.5% | 114.0% |
| 83 | 91.0% | 22.0% | 113.0% |
| 84 | 91.5% | 20.5% | 112.0% |
| 85 | 92.0% | 19.0% | 111.0% |
| 86 | 92.5% | 17.5% | 110.0% |
| 87 | 93.0% | 16.0% | 109.0% |
| 88 | 93.5% | 14.5% | 108.0% |
| 89 | 94.0% | 13.0% | 107.0% |
| 90 | 94.5% | 11.5% | 106.0% |
| 91 | 95.0% | 10.0% | 105.0% |
| 92 | 95.5% | 9.0% | 104.5% |
| 93 | 96.0% | 8.0% | 104.0% |
| 94 | 96.5% | 7.0% | 103.5% |
| 95 | 97.0% | 6.0% | 103.0% |
| 96 | 97.5% | 5.0% | 102.5% |
| 97 | 98.0% | 4.0% | 102.0% |
| 98 | 98.5% | 3.0% | 101.5% |
| 99 | 99.0% | 2.0% | 101.0% |
| 100 | 99.5% | 1.0% | 100.5% |
| 101 | 100.0% | 0.0% | 100.0% |

FIG. 18

| POSITION | L | R | SUM |
|---|---|---|---|
| 1 | 0.0% | 100.0% | 100.0% |
| 2 | 1.0% | 99.5% | 100.5% |
| 3 | 2.0% | 99.0% | 101.0% |
| 4 | 3.0% | 98.5% | 101.5% |
| 5 | 4.0% | 98.0% | 102.0% |
| 6 | 5.0% | 97.5% | 102.5% |
| 7 | 6.0% | 97.0% | 103.0% |
| 8 | 7.0% | 96.5% | 103.5% |
| 9 | 8.0% | 96.0% | 104.0% |
| 10 | 9.0% | 95.5% | 104.5% |
| 11 | 10.0% | 95.0% | 105.0% |
| 12 | 11.0% | 94.5% | 105.5% |
| 13 | 12.0% | 94.0% | 106.0% |
| 14 | 13.0% | 93.5% | 106.5% |
| 15 | 14.0% | 93.0% | 107.0% |
| 16 | 15.0% | 92.5% | 107.5% |
| 17 | 16.0% | 92.0% | 108.0% |
| 18 | 17.0% | 91.5% | 108.5% |
| 19 | 18.0% | 91.0% | 109.0% |
| 20 | 19.0% | 90.5% | 109.5% |
| 21 | 20.0% | 90.0% | 110.0% |
| 22 | 21.0% | 89.5% | 110.5% |
| 23 | 22.0% | 89.0% | 111.0% |
| 24 | 23.0% | 88.5% | 111.5% |
| 25 | 24.0% | 88.0% | 112.0% |
| 26 | 25.0% | 87.5% | 112.5% |
| 27 | 26.0% | 87.0% | 113.0% |
| 28 | 27.0% | 86.5% | 113.5% |
| 29 | 28.0% | 86.0% | 114.0% |
| 30 | 29.0% | 85.5% | 114.5% |
| 31 | 30.0% | 85.0% | 115.0% |
| 32 | 31.0% | 84.5% | 115.5% |
| 33 | 32.0% | 84.0% | 116.0% |
| 34 | 33.0% | 83.5% | 116.5% |
| 35 | 34.0% | 83.0% | 117.0% |
| 36 | 35.0% | 82.5% | 117.5% |
| 37 | 36.0% | 82.0% | 118.0% |
| 38 | 37.0% | 81.5% | 118.5% |
| 39 | 38.0% | 81.0% | 119.0% |
| 40 | 39.0% | 80.5% | 119.5% |
| 41 | 40.0% | 80.0% | 120.0% |
| 42 | 41.0% | 79.0% | 120.0% |
| 43 | 42.0% | 78.0% | 120.0% |
| 44 | 43.0% | 77.0% | 120.0% |
| 45 | 44.0% | 76.0% | 120.0% |
| 46 | 45.0% | 75.0% | 120.0% |
| 47 | 46.0% | 74.0% | 120.0% |
| 48 | 47.0% | 73.0% | 120.0% |
| 49 | 48.0% | 72.0% | 120.0% |
| 50 | 49.0% | 71.0% | 120.0% |
| 51 | 50.0% | 70.0% | 120.0% |
| 52 | 51.0% | 69.0% | 120.0% |
| 53 | 52.0% | 68.0% | 120.0% |
| 54 | 53.0% | 67.0% | 120.0% |
| 55 | 54.0% | 66.0% | 120.0% |
| 56 | 55.0% | 65.0% | 120.0% |
| 57 | 56.0% | 64.0% | 120.0% |
| 58 | 57.0% | 63.0% | 120.0% |
| 59 | 58.0% | 62.0% | 120.0% |
| 60 | 59.0% | 61.0% | 120.0% |
| 61 | 60.0% | 60.0% | 120.0% |
| 62 | 61.0% | 59.0% | 120.0% |
| 63 | 62.0% | 58.0% | 120.0% |
| 64 | 63.0% | 57.0% | 120.0% |
| 65 | 64.0% | 56.0% | 120.0% |
| 66 | 65.0% | 55.0% | 120.0% |
| 67 | 66.0% | 54.0% | 120.0% |
| 68 | 67.0% | 53.0% | 120.0% |
| 69 | 68.0% | 52.0% | 120.0% |
| 70 | 69.0% | 51.0% | 120.0% |
| 71 | 70.0% | 50.0% | 120.0% |
| 72 | 71.0% | 49.0% | 120.0% |
| 73 | 72.0% | 48.0% | 120.0% |
| 74 | 73.0% | 47.0% | 120.0% |
| 75 | 74.0% | 46.0% | 120.0% |
| 76 | 75.0% | 45.0% | 120.0% |
| 77 | 76.0% | 44.0% | 120.0% |
| 78 | 77.0% | 43.0% | 120.0% |
| 79 | 78.0% | 42.0% | 120.0% |
| 80 | 79.0% | 41.0% | 120.0% |
| 81 | 80.0% | 40.0% | 120.0% |
| 82 | 80.5% | 39.0% | 119.5% |
| 83 | 81.0% | 38.0% | 119.0% |
| 84 | 81.5% | 37.0% | 118.5% |
| 85 | 82.0% | 36.0% | 118.0% |
| 86 | 82.5% | 35.0% | 117.5% |
| 87 | 83.0% | 34.0% | 117.0% |
| 88 | 83.5% | 33.0% | 116.5% |
| 89 | 84.0% | 32.0% | 116.0% |
| 90 | 84.5% | 31.0% | 115.5% |
| 91 | 85.0% | 30.0% | 115.0% |
| 92 | 85.5% | 29.0% | 114.5% |
| 93 | 86.0% | 28.0% | 114.0% |
| 94 | 86.5% | 27.0% | 113.5% |
| 95 | 87.0% | 26.0% | 113.0% |
| 96 | 87.5% | 25.0% | 112.5% |
| 97 | 88.0% | 24.0% | 112.0% |
| 98 | 88.5% | 23.0% | 111.5% |
| 99 | 89.0% | 22.0% | 111.0% |
| 100 | 89.5% | 21.0% | 110.5% |
| 101 | 90.0% | 20.0% | 110.0% |
| 102 | 90.5% | 19.0% | 109.5% |
| 103 | 91.0% | 18.0% | 109.0% |
| 104 | 91.5% | 17.0% | 108.5% |
| 105 | 92.0% | 16.0% | 108.0% |
| 106 | 92.5% | 15.0% | 107.5% |
| 107 | 93.0% | 14.0% | 107.0% |
| 108 | 93.5% | 13.0% | 106.5% |
| 109 | 94.0% | 12.0% | 106.0% |
| 110 | 94.5% | 11.0% | 105.5% |
| 111 | 95.0% | 10.0% | 105.0% |
| 112 | 95.5% | 9.0% | 104.5% |
| 113 | 96.0% | 8.0% | 104.0% |
| 114 | 96.5% | 7.0% | 103.5% |
| 115 | 97.0% | 6.0% | 103.0% |
| 116 | 97.5% | 5.0% | 102.5% |
| 117 | 98.0% | 4.0% | 102.0% |
| 118 | 98.5% | 3.0% | 101.5% |
| 119 | 99.0% | 2.0% | 101.0% |
| 120 | 99.5% | 1.0% | 100.5% |
| 121 | 100.0% | 0.0% | 100.0% |

DIVISIONAL EXPOSURE APPARATUS AND METHOD OF MANUFACTURING LIQUID CRYSTAL DISPLAY USING THE SAME

CROSS-REFERENCE TO RELATED APPLICATION

Pursuant to 35 U.S.C. § 119(a), this application claims the benefit of earlier filing date and right of priority to Korean Application No. 10-2016-0052410, filed on Apr. 28, 2016, the contents of which is incorporated by reference herein in its entirety.

BACKGROUND DISCLOSURE

Field of the Disclosure

The present disclosure relates to an exposure apparatus, and more particularly, to a divisional exposure apparatus for forming a photo-acrylic layer using exposure, in a large-size liquid crystal display with a color filter-on-TFT (COT) structure, and a method of manufacturing a liquid crystal display using the same.

Description of the Background

Generally, a liquid crystal display is a display device that supplies a data signal corresponding to picture information individually to pixels arranged in a matrix form and adjusts the optical transmittance of the pixels to display a desired image.

Thus, the liquid crystal display comprises a liquid crystal panel where the pixels are arranged in a matrix form and has a drive part for driving the pixels.

The liquid crystal panel includes an array substrate and a color filter substrate which face each other and are joined together to maintain a uniform cell gap, and a liquid crystal layer formed in the cell gap between the array substrate and the color filter substrate.

A common electrode and pixel electrodes are formed on the liquid crystal panel with the array substrate and the color filter substrate joined together, to apply an electric field to the liquid crystal layer.

Thus, by controlling the voltage of a data signal applied to the pixel electrodes while a voltage is applied to the common electrode, the liquid crystals in the liquid crystal layer rotate by dielectric anisotropy in response to the electric field between the common electrode and the pixel electrodes, thus allowing light to pass through each pixel or blocking it to display texts or images.

To manufacture such a liquid crystal display, multiple patterning (masking) is required. Patterning is a process for forming a predetermined pattern by coating a photoresist laye onto a substrate to form a thin-film, then performing light exposures by an exposure apparatus, and then performing a sequence of development and etching steps.

For exposure, which is a processing step of patterning, either stepper-type exposure or scan-type exposure, which is mainly used currently.

The stepper-type exposure is a step-and-repeat exposure that selects multiple fields on a substrate, then performs exposure onto a corresponding field, through an exposure area of a reduction projection lens, and then sequentially moves to other unexposed fields to perform exposure. This method was proposed as an alternative to the same magnification projection exposure methods.

The stepper method provides high overlay accuracy because detection of one alignment key with respect to the entire single field allows for a single exposure patterning. However, it also has a drawback of a low productivity because multiple exposures should be made across the entire substrate consisting of multiple fields.

In the stepper method, the amount of light falling on the substrate is adjusted while the substrate and the mask remain unmoved, whereas, in a scanner method, proposed as an alternative to the stepper method, the area of exposure is increased by moving the substrate and the mask in opposite directions to each other during the exposure with a certain speed ratio.

FIG. 1 is a view exemplifying a general divisional exposure method.

FIG. 1 is an exposure pattern diagram for explaining in detail a scan-type exposure method, which shows an exposure pattern obtained by moving a mask stage and a substrate stage in repeated exposures for large-area exposure.

Referring to FIG. 1, an exposure is performed in the order of Scan 1→Move→Scan 2→Scan 3, and an example of light illumination patterns transferred onto the exposure surface of the substrate are illustrated as in W1, W2, and W3.

According to this operation, an exposure pattern is formed over the substrate in the order of first exposure part ①→second exposure part ②→third exposure part ③. In this case, a fourth exposure part ④, which is an overlap region of the first and second exposure parts ① and ②, and a fifth exposure part ⑤, which is an overlap region of the third and fourth exposure parts ③ and ④, are also formed.

Here, the fourth exposure part ④ is an exposure energy overlap region formed by Scan 1 and Scan 2, and the fifth exposure part ⑤ is an exposure energy overlap region formed by Scan 2 and Scan 3. The total amount of exposure energy supplied to each of the overlap regions, that is, the sum of the illumination intensities, is equal to the amount of exposure energy in each of the non-overlap regions of the first, second, and third exposure parts ①, ②, and ③.

FIGS. 2A and 2B are graphs of illumination intensities and the sum of the illumination intensities in each region of FIG. 1.

More specifically, FIG. 2A shows the illumination intensities of Scan 1 and Scan 2 in each region, and FIG. 2B shows the sum of the illumination intensities of Scan 1 and Scan 2 in each region.

Referring to FIGS. 2A and 2B, in the case of the first exposure part ①, second exposure part ②, and third exposure part ③ formed by Scan 1 and Scan 2, for example, the total amount of energy in the fourth exposure part ④, an overlap region, supplied by Scan 1 and Scan 2 is equal to the amount of energy in each of the non-overlap regions of the first and second exposure parts ① and ②.

In this way, exposure occurs in such a way that the illumination intensities in the overlap region are linearly controlled from 0% to 100%, making the sum of the illumination intensities at the left and right sides amounting to 100%. While there is no serious issue of limitation with the usual positive photoresist if it is a full-tone (FT) or a halftone (HT), negative photoacryl (PAC) differs in thickness because the exposed area is cured and remains, thus affecting the cell gap.

That is, in the case of the related art divisional exposure, the illumination intensities at the left and right sides overlap in the overlap region, like 50%+50%, 60%+40%, and 70%+30%. This region is not as much cured as in 100% exposure, due to the characteristics of the photoresist or PAC, so the remaining PAC differs in thickness. About 7 to 8 black spots are seen in the part A.

Meanwhile, a misalignment may occur during the process of joining the color filter substrate and the array substrate together in the manufacture of a liquid crystal display. Taking this into consideration, a certain margin is provided when designing a black matrix.

Thus, the aperture area may get eroded by as much as the margin of error, thus leading to a low aperture ratio and thereby low brightness.

Moreover, a misalignment beyond the margin of error often causes a light leak, in which the light leak area is not fully covered by the black matrix.

In this case, the light leak is seen externally, which can degrade image quality.

To solve the aforementioned problems, a COT (color-filter-on-TFT) structure was proposed, which has color filters and a black matrix on the array substrate, rather than on the color filter substrate.

FIG. 3 is a schematic cross-sectional view of a cell structure in a non-overlap region and an overlap region, in a general divisional exposure method.

FIG. 4 is a schematic cross-sectional view of different cell structures in a non-overlap region and an overlap region, in a general divisional exposure method, in which case a PAC layer is formed on RGBW subpixels in the same manner, using a halftone process.

FIGS. 3 and 4 schematically depict a liquid crystal panel with a COT structure.

Referring to FIGS. 3 and 4, a liquid crystal display with a COT structure comprises an array substrate 15 and a color filter substrate 5 bonded to the array substrate 15, and gate lines (not shown) and data lines (not shown) intersect at RGBW subpixels R, B, G, and W on the array substrate 15.

Although not shown in detail, a thin-film transistor comprising a gate electrode, an active layer, and source/drain electrodes is formed at each intersection of the gate lines and the data lines.

Color filters 6r, 6g, and 6b are formed at the RGB subpixels R, B, and G, among the RGBW subpixels R, B, G, and W, and a PAC layer 8 consisting of photoacryl PAC is formed over the color filters 6r, 6g, and 6b and the W subpixel W.

A cylindrical column spacer 20 is formed to maintain a gap between the array substrate 15 and the color filter substrate 5.

Such a COT structure requires no margin for alignment errors when designing a black matrix, since the black matrix and the color filters 6r, 6g, and 6b are formed on the array substrate 15. Accordingly, when the aperture area is extended, the brightness is improved. Moreover, there is no light leak caused by misalignment, which may lead to high brightness.

The problem is that the PAC layer 8 should be formed on the RGBW subpixels R, G, B, and W in the same manner, in order to reduce the number of masks used for patterning in manufacturing a liquid crystal display with such a COT structure. In this case, a halftone process is required.

For models with such a panel size that an exposure apparatus can accomplish this with one scan, these issues can be solved with the current level of technology. On the other hand, in large-size models for which exposure should be made divisionally with multiple scans, a reduction in the thickness of the PAC layer 8 occurs in a divisional exposure area, i.e., an overlap region, as described above.

In the case of FIG. 3 where no halftone process is done, the RGBW subpixels R, G, B, and W in the overlap region all correspond to a full-tone (FT) area, so the entire cell gap g1 is constant even if the thickness of the PAC layer 8 in the overlap region is reduced by d1. That is, the cell gap g1 is equal for both the overlap region and the non-overlap region, and no black spots are seen.

However, in the case of FIG. 4 where a halftone process is done, the reduction d1 in thickness of the PAC layer 8 in the full-tone (FT) area of the overlap region is rather small, whereas the reduction d2 in thickness of the PAC layer 8 in the halftone (HT) area is much larger. This creates a difference between the reductions d1 and d2 in thickness of the PAC layer 8 in the full-tone (FT) area and the halftone (HT) area, and their entire cell gap g1 and g2 is different for the RGB subpixels R, G, and W and the W subpixel W. In this case, the issue of spots caused by the difference in cell gap arises when testing images.

That is, in the case of halftone exposure, the lower the target level of exposure, the larger the thickness difference. This creates a difference in thickness between the full-tone (FT) area and the halftone (HT) area, within the overlap region, and the cell gap g1 and g2 differs within a single pixel and this can cause black spots in the halftone (HT) area which is smaller in thickness.

As discussed above, there is no problem using a divisional exposure on other layers, but the halftone process has its limitations in overcoming the thickness difference in the PAC layer using the current illumination intensity profile.

SUMMARY OF THE DISCLOSURE

The present disclosure has been made in an effort to provide a divisional exposure apparatus which allows for forming a PAC layer uniformly on RGBW subpixels, using a divisional exposure, in a large-size liquid crystal display with a COT structure, and a method of manufacturing a liquid crystal display using the same.

Other features of the present disclosure will be described in the configuration and claims of the present disclosure as described hereinafter.

To achieve these and other advantages and in accordance with the purpose of this specification, as embodied and broadly described herein, an exemplary aspect of the present disclosure provides a divisional exposure apparatus comprising a blade that is located at one side of a light illumination pattern in an overlap region where scans overlap and that controls light exposure energy (illumination intensity) according to position, wherein the overlap region is divided into at least two regions, i.e., first and second regions, on which light falls, the first and second regions having different rates of increase in illumination intensity for different illumination intensities of different scans.

The light exposure energy for the edge (boundary) of the overlap region may be controlled such that, when one of the illumination intensities is 100%, the other illumination intensity is 0%.

The blade may have a certain curvature at a bottom edge that blocks the light illumination pattern.

The part where the light illumination pattern and the bottom edge meets may constitute the overlap region.

In the second region, the bottom edge of the blade may be cut upward, and, in the first region, the bottom edge may be cut at an angle towards the second region from a point where the light illumination pattern and the bottom edge meet.

The divisional exposure apparatus may further comprise an auxiliary blade, corresponding in shape to the part that is steeply cut towards the second region.

The auxiliary blade may be installed in the first region.

The sum of the illumination intensities at the edge of the overlap region may have a linear shape or the shape of a 3-point curve with a point of inflection, in the range of 100% to 120%.

The overlap region may be divided into a 1-1 region, a 1-2 region, a 1-3 region, and a second region for different illumination intensities of different scans, and the 1-1, 1-2, 1-3, and second regions may be linear with different slopes.

Another exemplary aspect of the present disclosure provides a divisional exposure apparatus comprising a blade that is located at one side of a light illumination pattern in an overlap region where scans overlap and that controls light exposure energy (illumination intensity) according to position, wherein the blade serves to control the sum of the illumination intensities at the center of the overlap region in the range of 120% to 130%.

Another exemplary aspect of the present disclosure provides a method of manufacturing a liquid crystal display with a COT structure, the method comprising forming RGB color filters at RGB subpixels on a second substrate where a thin-film transistor is formed, applying PAC onto the second substrate where the RGB color filters are formed and forming a PAC layer over the RGB color filters and a W-subpixel simultaneously by transferring a plurality of light illumination patterns onto the PAC by multiple scans, using a halftone mask; and joining the second substrate with the PAC layer and a first substrate together.

The sum of the illumination intensities at the center of an overlap region where scans overlap may be controlled in the range of 120% to 130%.

The overlap region may be divided into at least two regions, i.e., first and second regions, to which a light illumination pattern is transferred, the first and second regions having different rates of increase in illumination intensity for different illumination intensities of different scans.

The sum of the illumination intensities at the center of the overlap region may be constant, and when the position moves in increments of 1 mm, the illumination intensity of Scan 1 increases in increments of 1% while the illumination intensity of Scan 2 which overlaps Scan 1 decreases in increments of 1%.

The sum of the illumination intensities at the edge of the overlap region may have a linear shape or the shape of a 3-point curve with a point of inflection, in the range of 100% to 120%.

It is to be understood that both the foregoing general description and the following detailed description are exemplary and explanatory and intend to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate exemplary aspect and together with the description serve to explain the principles of the disclosure.

In the drawings:

FIG. 9 is a table showing, by way of example, illumination intensities of Scan 1 and Scan 2 and the sum of the illumination intensities according to position in the overlap region, in the divisional exposure method according to the second exemplary aspect of the present disclosure;

FIG. 13 is a table showing, by way of example, illumination intensities of Scan 1 and Scan 2 and the sum of the illumination intensities according to position in the overlap region, in the divisional exposure method according to the third exemplary aspect of the present disclosure;

FIG. 16 is a table showing, by way of example, illumination intensities of Scan 1 and Scan 2 and the sum of the illumination intensities according to position in the overlap region, in the divisional exposure method according to the fourth exemplary aspect of the present disclosure;

FIG. 18 is a table showing, by way of example, illumination intensities of Scan 1 and Scan 2 and the sum of the illumination intensities according to position in the overlap region, in the divisional exposure method according to the fifth exemplary aspect of the present disclosure.

DETAILED DESCRIPTION OF THE DISCLOSURE

Figure 1:
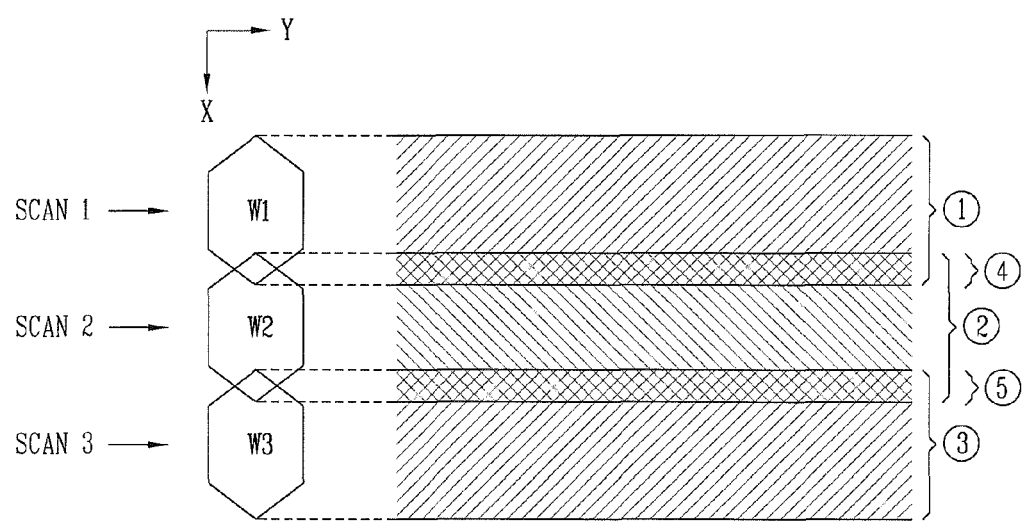
FIG. 1 is a view exemplifying a general divisional exposure method.
Figure 2A:
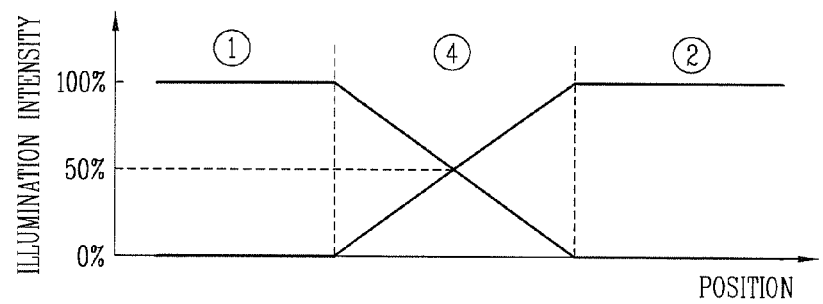
FIGS. 2A and 2B are graphs of illumination intensities and the sum of the illumination intensities in each region of FIG. 1.
Figure 2B:
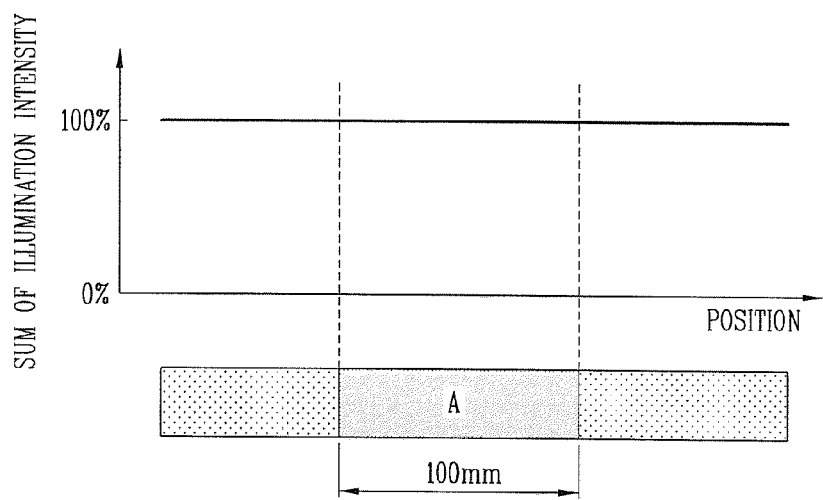
Figure 3:
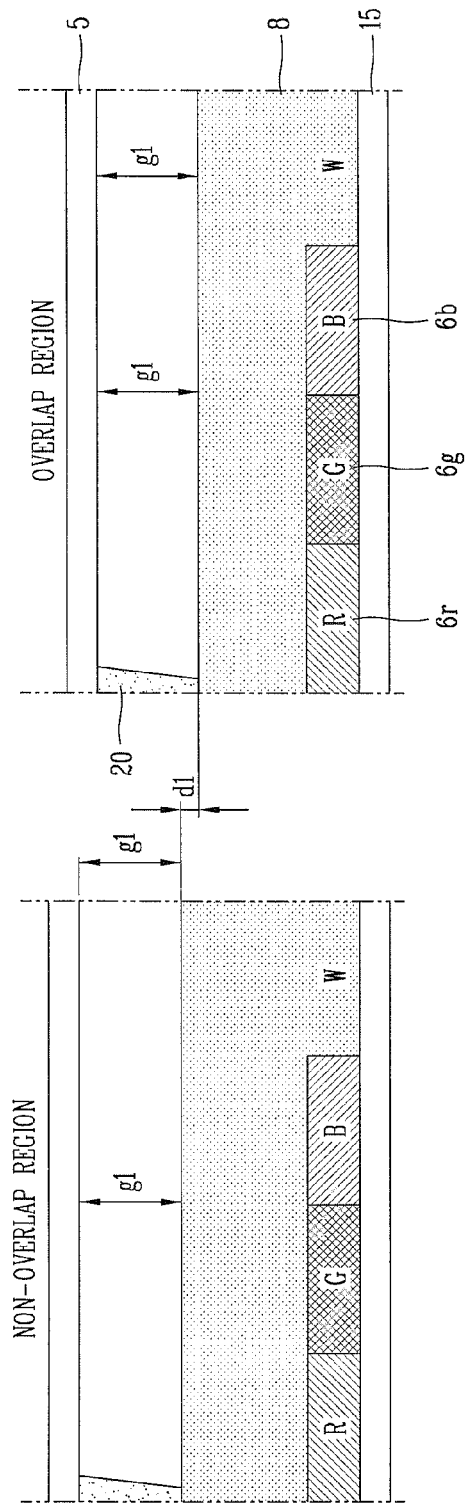
FIG. 3 is a schematic cross-sectional view of a cell structure in a non-overlap region and an overlap region, in a general divisional exposure method.
Figure 4:
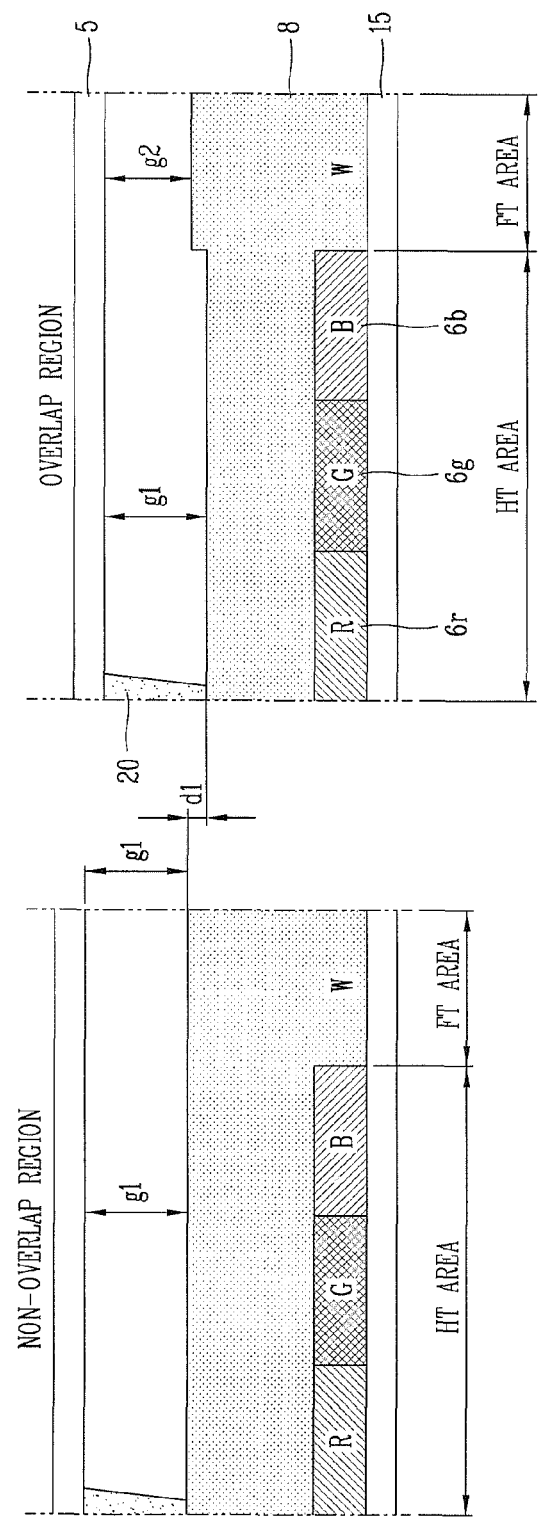
FIG. 4 is a schematic cross-sectional view of different cell structures in a non-overlap region and an overlap region, in a general divisional exposure method.

Hereinafter, exemplary aspects of a divisional exposure apparatus and a method of manufacturing a liquid crystal display using the same according to the present disclosure will be described in detail with reference to the accompanying drawings such that a person skilled in the art to which the present disclosure pertains may easily carry out.

Advantages and features of the present inventive concept and methods of accomplishing the same may be understood more readily by reference to the following detailed description of preferred aspects and the accompanying drawings. The present inventive concept may, however, be embodied in many different forms and should not be construed as being limited to the aspects set forth herein. Rather, these aspects are provided so that this disclosure will be thorough and complete and will fully convey the scope of the inventive concept to those skilled in the art, and the present inventive concept will only be defined by the appended claims. Like reference numerals refer to like elements throughout the specification. In the drawings, sizes and relative sizes of layers and regions may be exaggerated for clarity.

It will be understood that when an element or layer is referred to as being "on" or "over" another element or layer, the element or layer can be directly on another element or layer or intervening elements or layers may also be present. In contrast, when an element is referred to as being "directly on" or "directly over" another element or layer, there are no intervening elements or layers present.

Spatially relative terms, such as "beneath," "below," "lower," "above," "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

The terminology used herein is for the purpose of describing particular example aspects only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated components, steps, operations, and/or components, but do not preclude the presence or addition of one or more other components, steps, operations, and/or components thereof.

Figure 5:
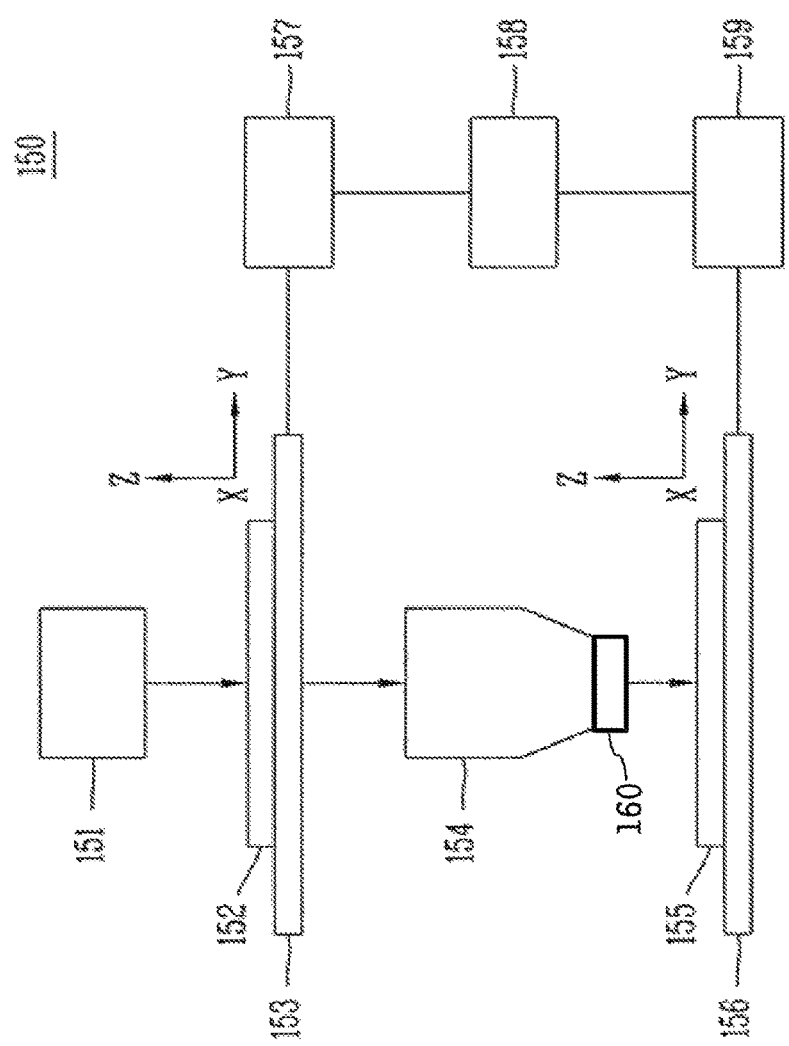
FIG. 5 is a view showing an example of a divisional exposure apparatus according to the present disclosure.

FIG. 5 is a view showing an example of a divisional exposure apparatus according to the present disclosure.

Referring to FIG. 5, a scan-type divisional exposure 150 according to the present disclosure may comprise, for example, an illumination system 151 that generates light of a certain wavelength, a mask stage 153 where a mask 152 is loaded, a projection optical system 154 that reduces and projects light generated from the illumination system 151, a substrate stage 156 where a substrate 155 is loaded, and controllers 157, 158, and 159 for controlling these components.

The controllers 157, 158, and 159 may include a mask stage controller 157 that controls the scan rate and alignment of the mask stage 153, a substrate stage controller 159 that controls the scan rate and alignment of the substrate stage 156, and a main controller 158 that controls the mask stage controller 157 and the substrate stage controller 159.

A blade (not shown) may be provided between the projection optical system 154 and the substrate stage 156. The blade serves to control exposure energy falling on an overlap region where scans overlap, according to position.

Moreover, an auxiliary blade (not shown) may be added to more precisely control the exposure energy falling on the edge of the overlap region. The auxiliary blade may be installed between the projection optical system 154 and the substrate stage 156 and also between the mask stage 153 and the substrate stage 156, depending on the overlap width.

The operational configuration of the scan-type divisional exposure apparatus 150 thus constructed will be described as follows.

First of all, the mask 152 is loaded and fixed onto the mask stage 153 located below the illumination system 151, and then the mask stage 153 moves in the Y direction. When a slit of light is emitted from the illumination system 151 onto the mask 152 sitting on the mask stage 153, the light from the illumination system 151 allows a thin-film pattern formed on the mask 152 to be transferred down the mask 152.

The light passes through the projection optical system 154 and is transmitted from the bottom of the projection optical system 154 onto the substrate stage 156, where the substrate 155 is loaded, that moves in the opposite direction (−Y direction) to the mask stage 153. Then, the substrate 155 over the substrate stage 156 is exposed to the transmitted light by scanning, thereby completing the exposure process on the substrate 155.

However, the present disclosure is not limited to the above-described divisional exposure apparatus and its operation method.

For the manufacture of large-size liquid crystal displays of 65-inches and above, divisional exposure is used, and a mask process is performed on negative photoresist because an exposed area is cured and remains. That is, for super-sized TV products, exposure is made with multiple shots or scans because it is not possible to manufacture a liquid crystal panels with one shot or scan by an exposure apparatus.

In this case, in the case of related art division exposure, an illumination intensity overlap occurs in the overlap region, like 50%+50% (also 60%+40%, 70%+30%, etc. depending on the positions of left and right blades that block an illumination area in the exposure apparatus). This region is not as much cured as in 100% exposure, due to the characteristics of the photoresist, so the PAC differs in thickness.

As described previously, in the case of full-tone (FT), the cell gap is equal for both the non-overlap region and the overlap region, and no black spots are seen. On the other hand, in the case of halftone (HT), the lower the target level of exposure (ex., FT transmittance: 100%, HT transmittance: 30~40%), the larger the thickness difference. This creates a difference in PAC thickness between the FT area for the W subpixel and the HT area for the RGB subpixels, within the overlap region, and the cell gap differs within a single pixel, thus causing black spots.

A PAC layer made using a negative PAC material is especially sensitive to overlapping exposures, and if a mask on the PAC layer is opened or closed 100%, the difference in PAC thickness in the overlap region may be small compared with the non-overlap region. This provides a large margin for spots and thereby enables mass production.

However, a halftone mask, which is manufactured by adjusting transmittance, may have spots because of the large difference in PAC thickness in the overlap region compared with the non-overlap region.

If the HT thickness reduction is larger than the FT thickness reduction, in the overlap region, black spots are visible. If the HT thickness reduction is smaller than the FT thickness reduction, white spots are visible.

Accordingly, the present disclosure is characterized in that illumination intensity is adjusted such that the sum of the illumination intensities in the overlap region is higher than 100% in FT, preferably, from 120% to 130%. However, the present disclosure is not limited to this, and the illumination intensity adjustment may vary according to the sensitivity of PAC material to light and the sum of the illumination intensities in the overlap region may be adjusted from 100% to 140%.

Figure 6:
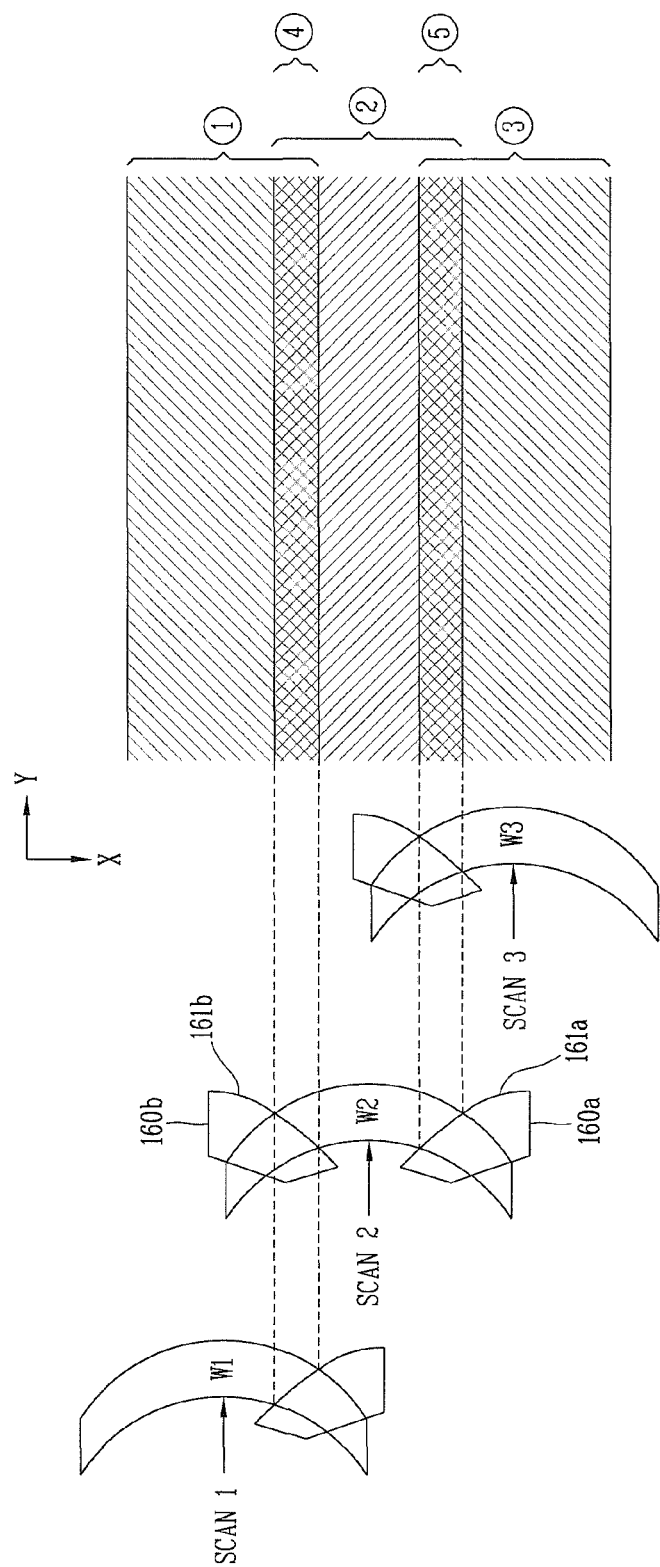
FIG. 6 is a view illustrating a divisional exposure method according to the present disclosure.

FIG. 6 is a view illustrating a divisional exposure method according to the present disclosure.

FIG. 6 is an exposure pattern diagram for explaining in detail a scan-type exposure method, which shows an exposure pattern obtained by moving a mask stage and a substrate stage in repeated exposures for large-area exposure.

Referring to FIG. 6, an exposure is performed in the order of Scan 1→Move→Scan 2→Scan 3, and an example of curve-shaped light illumination patterns transferred onto the exposure surface of the substrate are illustrated as in W1, W2, and W3.

According to this operation, an exposure pattern is formed over the substrate in the order of first exposure part ①→second exposure part ②→third exposure part ③. In this case, a fourth exposure part ④, which is an overlap region of the first and second exposure parts ① and ②, and a fifth exposure part ⑤, which is an overlap region of the third and fourth exposure parts ③ and ④, are also formed.

Here, the fourth exposure part ④ is an exposure energy overlap region formed by Scan 1 and Scan 2, and the fifth exposure part ⑤ is an exposure energy overlap region formed by Scan 2 and Scan 3. Exposure energy may be controlled according to position by the blades 160a and 160b. That is, the blades 160a and 160b are located on either side of the light illumination patterns W1, W2, and W3, and serve to control exposure energy falling on an overlap region where scans overlap, according to position.

The left blade 160a and the right blade 160b may be symmetrical with respect to the center of the light illumination patterns W1, W2, and W3.

Each blade 160a and 160b has a bottom edge 161a and 161b that crosses the light illumination patterns W1, W2, and W3 obliquely. Each bottom edge 161a and 161b has a certain curvature, and the parts where the light illumination patterns W1, W2, and W3 and the bottom edges 161a and 161b meet constitute the fourth exposure part ④ and the fifth exposure part ⑤, that is, exposure energy overlap regions.

The total amount of exposure energy supplied to each of the overlap regions, that is, the sum of the illumination intensities, is equal to the amount of exposure energy in each of the non-overlap regions of the first, second, and third exposure parts ①, ②, and ③.

As described previously, the present disclosure is characterized in that the sum of the illumination intensities is set in the range of 120% to 130% in order to improve spots in the overlap region.

Figure 7A:
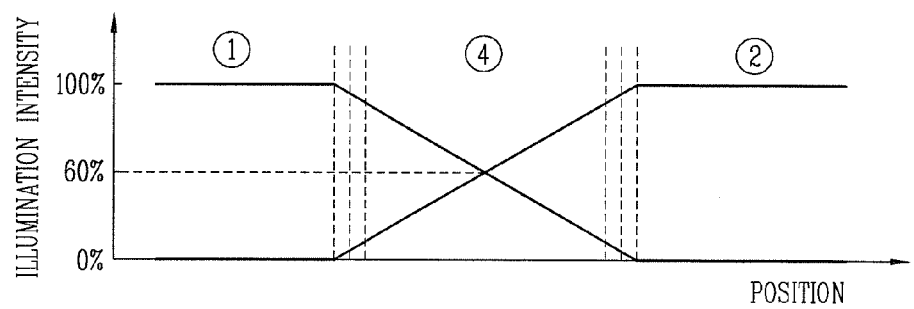
FIGS. 7A and 7B are graphs of illumination intensities and the sum of the illumination intensities in each region, in a divisional exposure method according to a first exemplary aspect of the present disclosure.
Figure 7B:
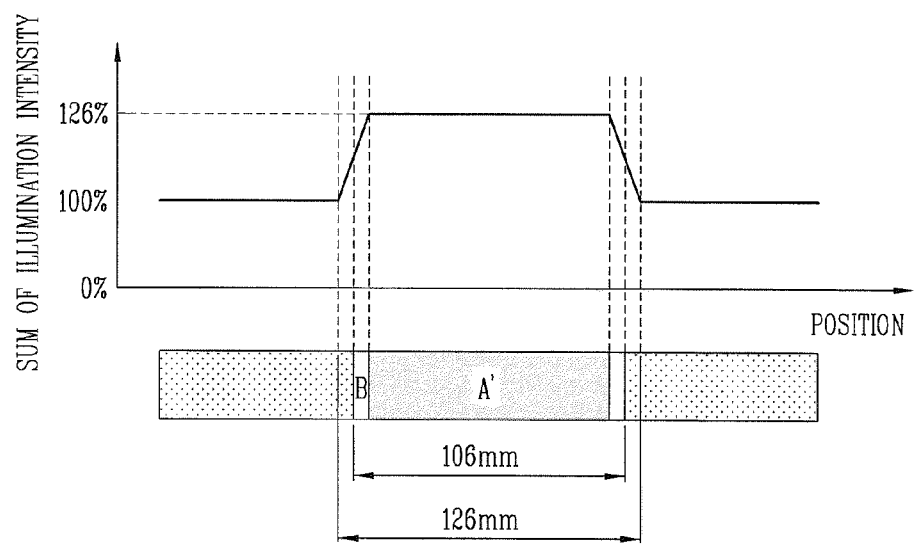

FIGS. 7A and 7B are graphs of illumination intensities and the sum of the illumination intensities in each region, in a divisional exposure method according to a first exemplary aspect of the present disclosure.

FIG. 7A shows the illumination intensities of Scan 1 and Scan 2 in each region, and FIG. 7B shows the sum of the illumination intensities of Scan 1 and Scan 2 in each region.

The divisional exposure method according to the first exemplary aspect of the present disclosure, depicted in FIGS. 7A and 7B, will be described with an example in which the sum of the illumination intensities at the left and right sides is increased by reducing the area in the light illumination pattern blocked by the blade by moving the blade up to 13 mm upwards (i.e., left and right) from the light illumination pattern.

Referring to FIGS. 7A and 7B, in the first exemplary aspect of the present disclosure, in the case of the first exposure part ①, second exposure part ②, and third exposure part ③ formed by Scan 1 and Scan 2, for example, the total amount of energy in the fourth exposure part ④, an overlap region, supplied by Scan 1 and Scan 2 may be set larger than the amount of energy in each of the non-overlap regions of the first and second exposure parts ① and ②.

An actual test was conducted by changing the positions of the blades in the divisional exposure apparatus, and the test result showed that, if the sum of the illumination intensities at the left and right sides is increased from 50%+50% to 63%+63%, the number of black spots at the center A' of the overlap region is reduced to 1~2 from 7~8 in the related art. That is, the respective illumination intensities in the overlap region may linearly increase from 0% to 100%, and the light illumination pattern may be open in front of 13 mm compared to the related art such that the sum of the illumination intensities at the center A' of the overlap region amounts to 126%.

Therefore, it can be seen that the number of black spots is determined depending on how the illumination intensities at the left and right sides combine.

That is, the present disclosure is characterized in that the sum of the illumination intensities at the center A' of the overlap region is set in the range of 120% to 130%. It was confirmed that black spots were seen when the sum of the illumination intensities was below 120% and whitening occurred when the sum of the illumination intensities was 120% or above.

In this case, however, about five white spots (white strips) were observed on the edge B of the overlap region. This is because the edge is exposed 100%+α in an exposure process of the exposure apparatus. That is, the amount of exposure is higher in the part where white spots are seen, and this makes the FT thickness reduction smaller than the HT thickness reduction and therefore produces white spots.

Hence, the illumination intensity profile needs to be controlled more finely on the edge of the overlap region, which will be described in detail with respect to the following second to fifth exemplary aspects. That is, the illumination intensity profile at the edge of overlap region, which is different from that at the center of the overlap region, is controlled such that, when one of the illumination intensities is 100%, the other one is 0%.

Figure 8A:
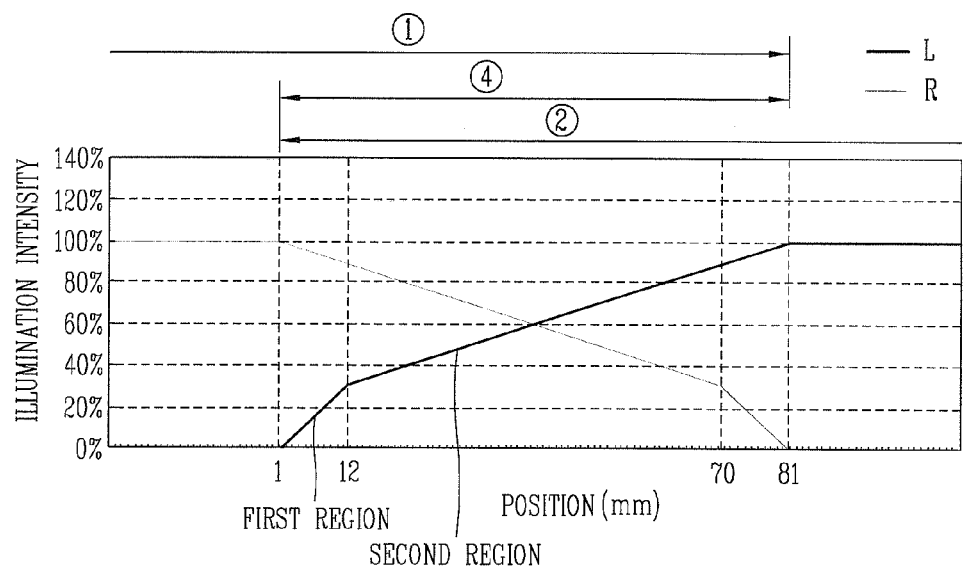
FIGS. 8A and 8B are graphs of illumination intensities and the sum of the illumination intensities in each region, in a divisional exposure method according to a second exemplary aspect of the present disclosure.
Figure 8B:
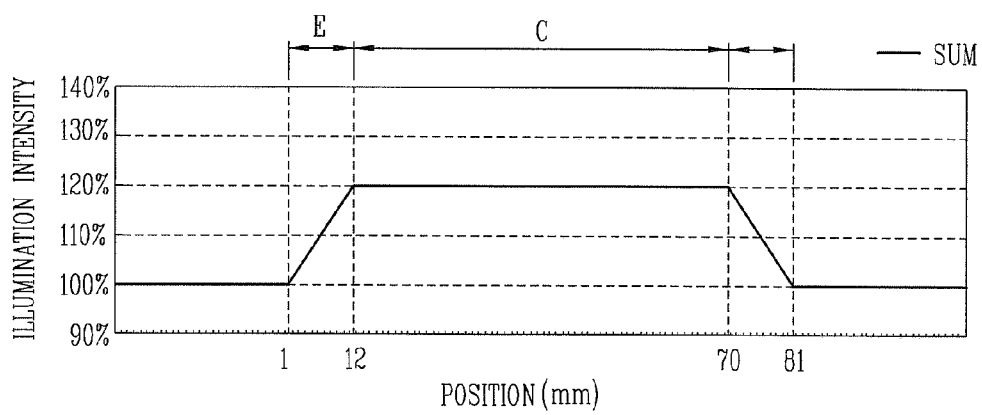

FIGS. 8A and 8B are graphs of illumination intensities and the sum of the illumination intensities in each region, in a divisional exposure method according to a second exemplary aspect of the present disclosure.

FIG. 8A shows the illumination intensities (L and R) of Scan 1 and Scan 2 according to position, and FIG. 8B shows the sum of the illumination intensities (L and R) of Scan 1 and Scan 2 according to position.

The divisional exposure method according to the second exemplary aspect of the present disclosure, depicted in FIGS. 8A and 8B, will be described with an example in which the illumination intensity profile of each scan in the overlap region, i.e., the fourth exposure part ④, is finely controlled for at least two regions, i.e., first and second regions. The width of the overlap region is set to 80 m, the width of the first region is set to 10 mm, and the width of the second region is set to 70 mm, but the present disclosure is not limited to this.

FIG. 9 is a table showing, by way of example, illumination intensities (L and R) of Scan 1 and Scan 2 and the sum of the illumination intensities according to position in the overlap region, in the divisional exposure method according to the second exemplary aspect of the present disclosure.

FIGS. 8A, 8B, and 9 are giving an example in which the illumination intensity L of Scan 1 increases from 0% to 100% when the position moves from 1 mm to 81 mm from one end of the overlap region, i.e., fourth exposure part ④, but this is merely for the convenience of explanation and the present disclosure is not limited to it.

Referring to FIGS. 8A and 8B, in the second exemplary aspect of the present disclosure, in the case of the first exposure part ①, second exposure part ②, and third exposure part ③ formed by Scan 1 and Scan 2, for example, the total amount of energy in the fourth exposure part ④, an overlap region, supplied by Scan 1 and Scan 2 may be set larger than the amount of energy in each of the non-overlap regions of the first and second exposure parts ① and ②.

It can be seen that, if the sum of the illumination intensities at the left and right of the center C of the overlap region is increased from 100% to 120%, the number of black spots at the center C of the overlap region is reduced to 1~2 from 7~8 in the related art. In this case, it is revealed that, when the position moves in increments of 1 mm in the range of 12 mm to 70 mm, the illumination intensity L of Scan 1 increases from 31% to 89% in increments of 1% while the illumination intensity R of Scan 2 decreases from 89% to 31% in decrements of 1%. Thus, it can be concluded that the sum of the illumination intensities at the center C of the overlap region is uniform 120%.

Moreover, in the second exemplary aspect of the present disclosure, it can be seen that the illumination intensity profile used for the edge E of the overlap region is different from that used for the center C of the overlap region, in order to prevent white spots at the edge E of the overlap region. That is, when the position moves in increments of 1 mm in the range of 1 mm to 12 mm, the illumination intensity L of Scan 1 increases from 1% to 31% in increments of 3% except for position 1 mm while the illumination intensity R of Scan 2 decreases from 100% to 89% in decrements of 1%. Thus, it can be concluded that the sum of the illumination intensities at the edge E of the overlap region linearly increases from 102% to 120%, except for when the position moves from 1 mm to 2 mm.

In this way, by dividing the overlap region into at least two regions, i.e., first and second regions, to use different illumination intensity profiles for these regions in each scan and configuring the illumination intensity profiles such that the rate of increase in illumination intensity in the first region is higher than that in the second region, white spots at the edge E of the overlap region may be prevented. That is, the illumination intensity profiles may be configured in such a way that the sum of the illumination intensities at the center C of the overlap region is maintained constant at 120% and the sum of the illumination intensities at the edge E of the overlap region increases smoothly.

This may solve the related art problem of the difference in entire cell gap between the RGB subpixels and the W subpixel.

Figure 10:
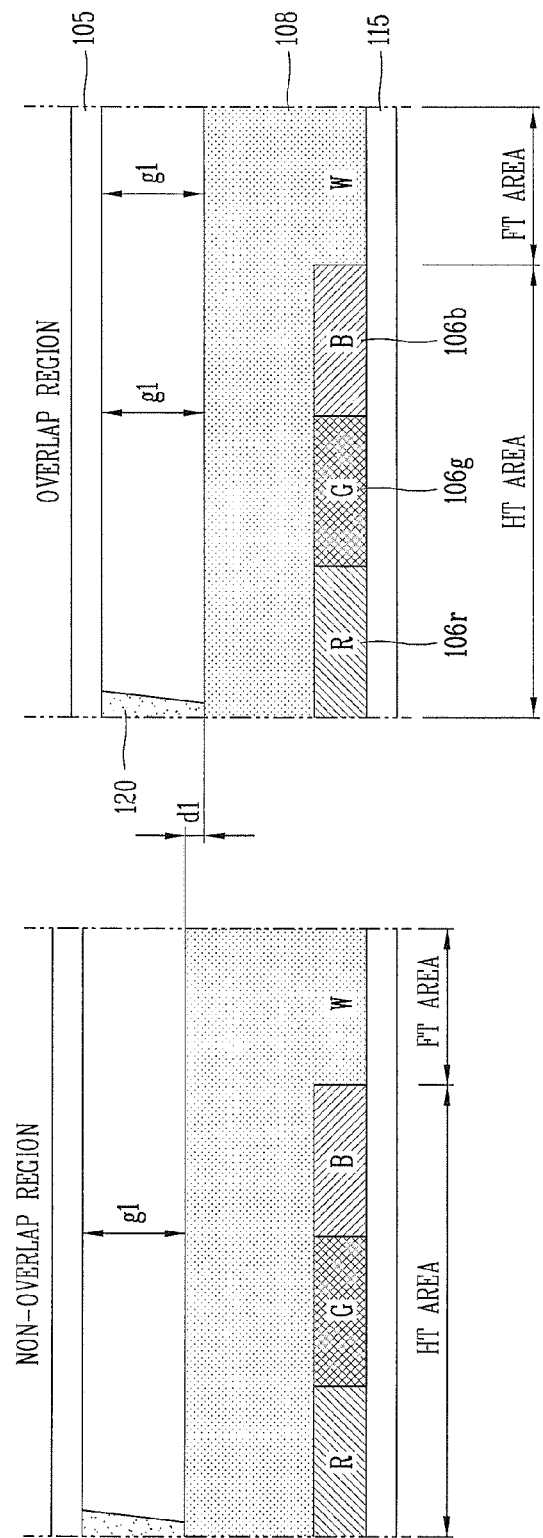
FIG. 10 is a schematic cross-sectional view of cell structures in overlap and non-overlap regions, when a divisional exposure apparatus according to the present disclosure is used.

FIG. 10 is a schematic cross-sectional view of cell structures in overlap and non-overlap regions, when a divisional exposure apparatus according to the present disclosure is used. In these cell structures, a PAC layer is formed on the RGBW subpixels in the same manner, using a halftone process.

FIG. 10 schematically depicts a liquid crystal panel with a COT structure.

Referring to FIG. 10, a liquid crystal display with a COT structure is formed by joining together a first substrate 105 as an upper substrate and a second substrate 115, i.e. color array substrate, as a lower substrate, with a gap in between them.

Although not shown in detail, gate lines are formed at one side of RGBW subpixels R, G, B, and W defined on one surface of the second substrate 115, and data lines are formed at the other side which intersects the one side, and a thin-film transistor comprising a gate electrode, an active layer, and source/drain electrodes is formed at each intersection of the gate lines and the data lines.

Color filters 106r, 106g, and 106b are formed at the RGB subpixels R, B, and G, among the RGBW subpixels R, B, G, and W, and a PAC layer 108 consisting of photoacryl PAC is formed over the color filters 106r, 106g, and 106b and the W subpixel W.

The color filters 106r, 106g, and 106b are arranged in various shapes.

In an example, the color filters 106r, 106g, and 106b may be arranged in a stripe pattern in which the same color filters are formed at the vertically arranged RGB subpixels R, B, and G.

A cylindrical column spacer 120 is formed to maintain a gap between the first substrate 105 and the second substrate 115.

The column spacer 120 is a black column spacer BCS, which may substitute for the black matrix. In this case, a cylindrical black column spacer 120 may be formed by coating the entire surface of the second substrate 115 with black resin comprising a ball spacer BS and patterning it.

A black carbon pigment may be added to the black column spacer 120 using polymer, in order to produce a black color, but usually the black column spacer 120 is formed by apply a thick coating and then patterning it by masking.

Besides, other methods such as an inkjet method may be used, in which case, polymer is dropped into a desired spot of the head of an inkjet device.

In twisted nematic (TN) mode, a common electrode facing a pixel electrode with a liquid crystal layer in between them may be provided on the inner surface of the first substrate 105. On the other hand, in in-plane switching (IPS) mode, which improves viewing angle by aligning the liquid crystal molecules parallel to the substrate, the common electrode may be formed within the second substrate 115 along with the pixel electrode. However, the present disclosure is not limited to this, and the present disclosure may be applied to liquid crystal displays with vertical alignment (VA) mode, fringe field switching (FFS) mode, super-IPS mode, and reverse TN IPS mode.

Such a COT structure requires no margin for alignment errors in the black matrix, since the color filters 106r, 106g, and 106b are formed on the second substrate 115, i.e., color-array substrate, and, especially in the present disclosure, the black matrix is omitted. Accordingly, the aperture area is extended, and the brightness is improved. Moreover, there is no light leak caused by misalignment, which may lead to high brightness.

Moreover, in the liquid crystal display with a COT structure according to the present disclosure, it can be seen that, even if there is a thickness reduction d1 of the PAC layer 108 in the overlap region when the PAC layer 108 is formed on the RGBW subpixels R, G, B, and W in a large-size model in the same manner, using a halftone mask, there is no difference in the thickness reduction d1 of the PAC layer 108 between the full-tone (FT) area and halftone (HT) area of the overlap region.

This means that, as described previously, if the sum of the illumination intensities in the overlap region is set in the range of 120% to 130%, there is no difference in the thickness reduction d1 of the PAC layer 108 between the full-tone (FT) area and the halftone (HT) area.

Thus, the entire cell gap g1 is uniform for the RGB subpixels R, G, and B and the W subpixel W, and there will be no issue of spots caused by the difference in cell gap when testing images.

Figure 11A:
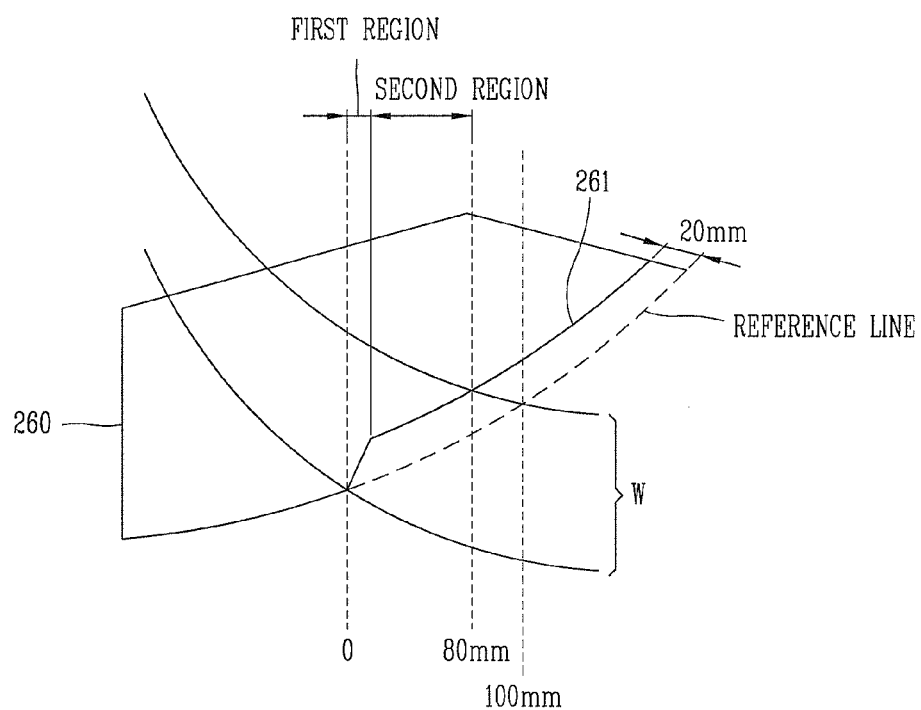
FIGS. 11A and 11B are schematic plan views of a blade structure in the divisional exposure apparatus according to the second exemplary aspect of the present disclosure.
Figure 11B:
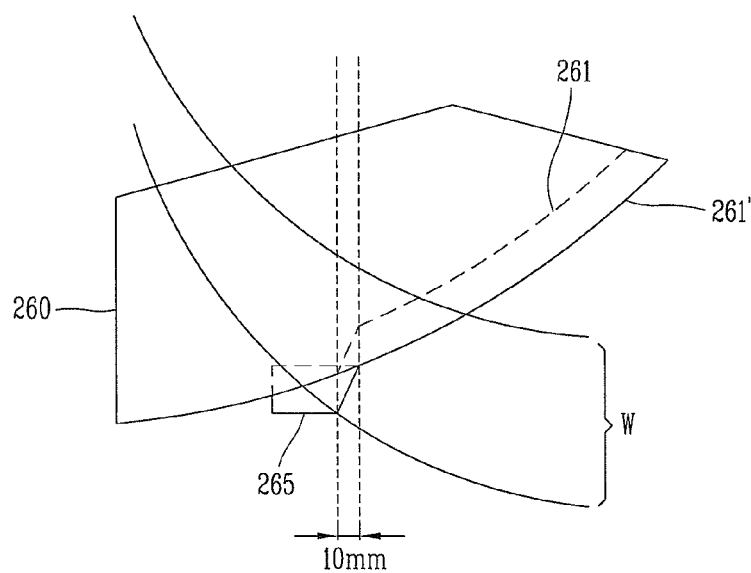

FIGS. 11A and 11B are schematic plan views of a blade structure in the divisional exposure apparatus according to the second exemplary aspect of the present disclosure, which depict a blade installed on one side of a light illumination pattern W by way of example.

Referring to FIG. 11A, a blade 260 according to the second exemplary aspect of the present disclosure has a certain curvature at an edge portion that blocks the light illumination pattern W, in order to control exposure energy falling on an overlap region where scans overlap, according to position. That is, the blade 260 has a bottom edge 261 that crosses the light illumination pattern W obliquely. The bottom edge 261 has a certain curvature, and the part where the light illumination pattern W and the bottom edge 261 meet constitutes an exposure energy overlap region.

For convenience of explanation, FIG. 11A illustrates the curvature of the edge portion of the blade indicated by a reference line, in the divisional exposure apparatus according to the first exemplary aspect of the present disclosure.

In this case, in the divisional exposure apparatus according to the first exemplary aspect of the present disclosure, the overlap exposure width is kept at 100 mm at every position, with 0 mm at a point where the light illumination pattern W and the bottom edge 261 meets.

On the contrary, in the divisional exposure apparatus according to the second exemplary aspect of the present disclosure, the overlap region may vary according to position, and it can be seen that, in the second region, the bottom edge 261 of the blade 260 is cut about 20 mm upward from the reference line while having substantially the same curvature as the reference line.

In the first region, the bottom edge 260 is cut at a steep angle towards the upward-cut, second region from the point 0 where the light illumination pattern W and the bottom edge 261 meet. The first region has a width of about 20 mm, and corresponds to the edge of the overlap region in an illumination intensity graph.

In this way, the blade 260 according to the present disclosure may be modified in shape to be optimized to a specific model, but in order to cope with a variety of models, it should be altered into different shapes optimized for different models.

To solve this problem, referring to FIG. 11B. the divisional exposure apparatus according to the second exemplary aspect of the present disclosure may comprise a bottom edge 261' corresponding to the reference line, and may further comprise an auxiliary blade 265 in the first region, corresponding to the part that is steeply cut towards the bottom edge 261 of the second region shown in FIG. 11A.

In this case, the bottom edge 261' of the blade 260 matches the reference line in the divisional exposure apparatus according to the first exemplary aspect of the present disclosure, and the auxiliary blade 265 is installed in the first region. That is, the first region, where the auxiliary blade 265 is sloped, that corresponds to the edge of the overlap region may have a width of 10 mm.

Figure 12A:
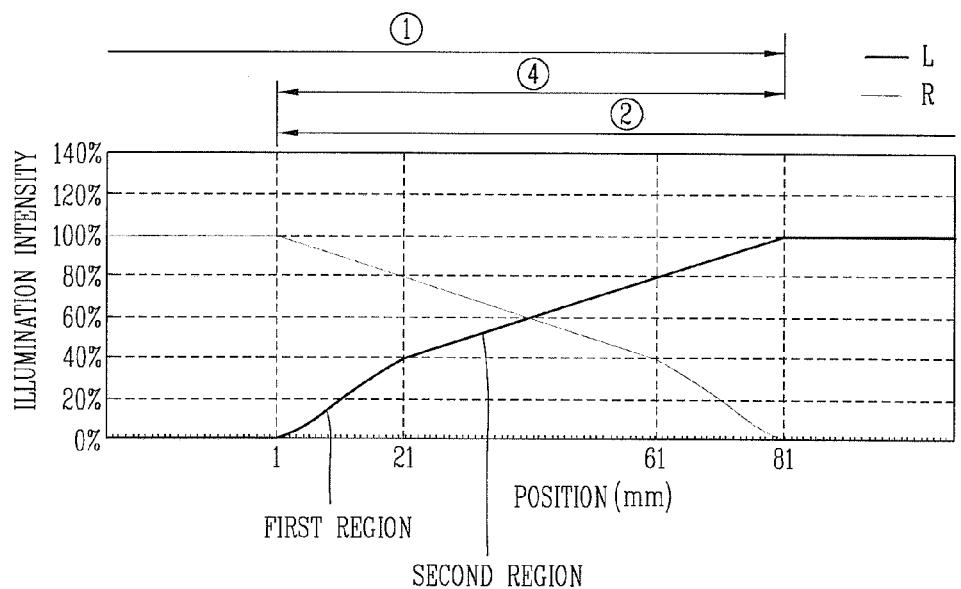
FIGS. 12A and 12B are graphs of illumination intensities and the sum of the illumination intensities in each region, in a divisional exposure method according to a third exemplary aspect of the present disclosure.
Figure 12B:
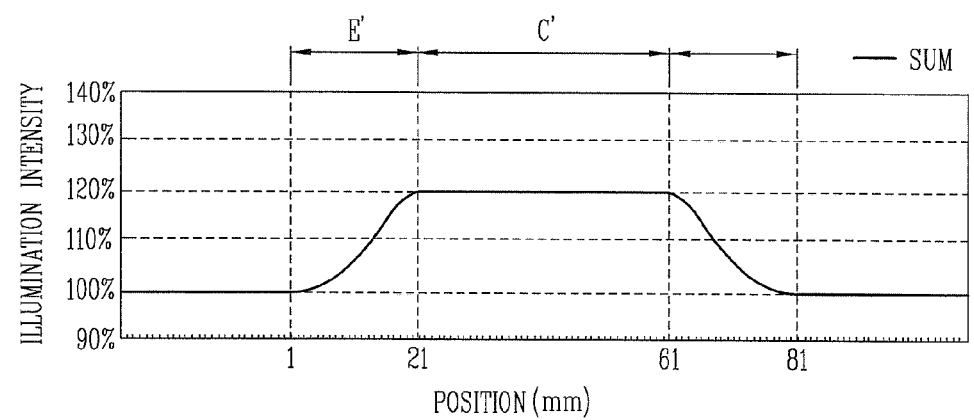

FIGS. 12A and 12B are graphs of illumination intensities and the sum of the illumination intensities in each region, in a divisional exposure method according to a third exemplary aspect of the present disclosure.

FIG. 12A shows the illumination intensities (L and R) of Scan 1 and Scan 2 according to position, and FIG. 12B shows the sum of the illumination intensities (L and R) of Scan 1 and Scan 2 according to position.

The divisional exposure method according to the third exemplary aspect of the present disclosure, depicted in FIGS. 12A and 12B, will be described with an example in which the illumination intensity profile of each scan in the overlap region, i.e., the fourth exposure part ④, is finely controlled for at least two regions, i.e., first and second regions. The width of the overlap region is set to 80 m, the width of the first region is set to 10 mm, and the width of the second region is set to 60 mm, but the present disclosure is not limited to this.

The divisional exposure method according to the third exemplary aspect of the present disclosure is characterized in that the first region is curved, rather than linear, and the first region is wider compared to the divisional exposure method according to the second exemplary aspect of the present disclosure.

FIG. 13 is a table showing, by way of example, illumination intensities (L and R) of Scan 1 and Scan 2 and the sum of the illumination intensities according to position in the overlap region, in the divisional exposure method according to the third exemplary aspect of the present disclosure.

FIGS. 12A, 12B, and 13 are giving an example in which the illumination intensity L of Scan 1 increases from 0% to 100% when the position moves from 1 mm to 81 mm from one end of the overlap region, i.e., fourth exposure part ④, but this is merely for the convenience of explanation and the present disclosure is not limited to it.

Referring to FIGS. 12A and 12B, in the third exemplary aspect of the present disclosure, in the case of the first exposure part ①, second exposure part ②, and third exposure part ④ formed by Scan 1 and Scan 2, for example, the total amount of energy in the fourth exposure part ④, an overlap region, supplied by Scan 1 and Scan 2 may be set larger than the amount of energy in each of the non-overlap regions of the first and second exposure parts ① and ②.

It can be seen that, if the sum of the illumination intensities at the left and right of the center C' of the overlap region is increased from 100% to 120%, the number of black spots at the center C' of the overlap region is reduced to 1~2 from 7~8 in the related art. In this case, it is revealed that, when the position moves in increments of 1 mm in the range of 21 mm to 61 mm, the illumination intensity L of Scan 1 increases from 40% to 80% in increments of 1% while the illumination intensity R of Scan 2 decreases from 80% to 40% in decrements of 1%. Thus, it can be concluded that the sum of the illumination intensities at the center C' of the overlap region is uniform 120%.

Moreover, in the third exemplary aspect of the present disclosure, it can be seen that the illumination intensity profile used for the edge E' of the overlap region is different from that used for the center C' of the overlap region, in order to prevent white spots at the edge E' of the overlap region.

That is, the illumination intensity L of Scan 1 increases from 0.0% to 2.0% in increments of 1.0% when the position moves in increments of 1 mm in the range of 1 mm to 3 mm, increases from 2.0% to 3.5% in an increment of 1.5% when the position moves in the range of 3 mm to 4 mm, and increases from 3.5% to 15.5% in increments of 2.0% when the position moves in increments of 1 mm in the range of 4 mm to 10 mm. Also, the illumination intensity L of Scan 1 increases from 15.5% to 20.5% in increments of 2.5% when the position moves in increments of 1 mm in the range of 10 mm to 12 mm, increases from 20.5% to 23.5% in an increment of 3.0% when the position moves in the range of 12 mm to 13 mm, and increases from 23.5% to 28.5% in increments of 2.5% when the position moves in increments of 1 mm in the range of 13 mm to 15 mm. Also, the illumination intensity L of Scan 1 increases from 28.5% to 38.5% in increments of 2.0% when the position moves in increments of 1 mm in the range of 15 mm to 20 mm, and increases from 38.5% to 40.0% in increments of 1.5% when the position moves in the range of 20 mm to 21 mm.

On the other hand, the illumination intensity R of Scan 2 decreases from 100.0% to 80.0% in decrements of 1.0% when the position moves in increments of 1 mm in the range of 1 mm to 21 mm.

Thus, it can be concluded that the sum of the illumination intensities at the edge E' of the overlap region increases from 100% to 120%, in a similar shape to a 3-point curve with a point of inflection.

In this way, by dividing the overlap region into at least two regions, i.e., first and second regions, to use different illumination intensity profiles for these regions in each scan and configuring the illumination intensity profiles such that the rate of increase in illumination intensity in the first region is higher than that in the second region, white spots at the edge E' of the overlap region may be prevented. That is, the illumination intensity profiles may be configured in such a way that the sum of the illumination intensities at the center C' of the overlap region is maintained constant at 120% and the sum of the illumination intensities at the edge E' of the overlap region increases smoothly in a similar shape to a 3-point curve.

Figure 14A:
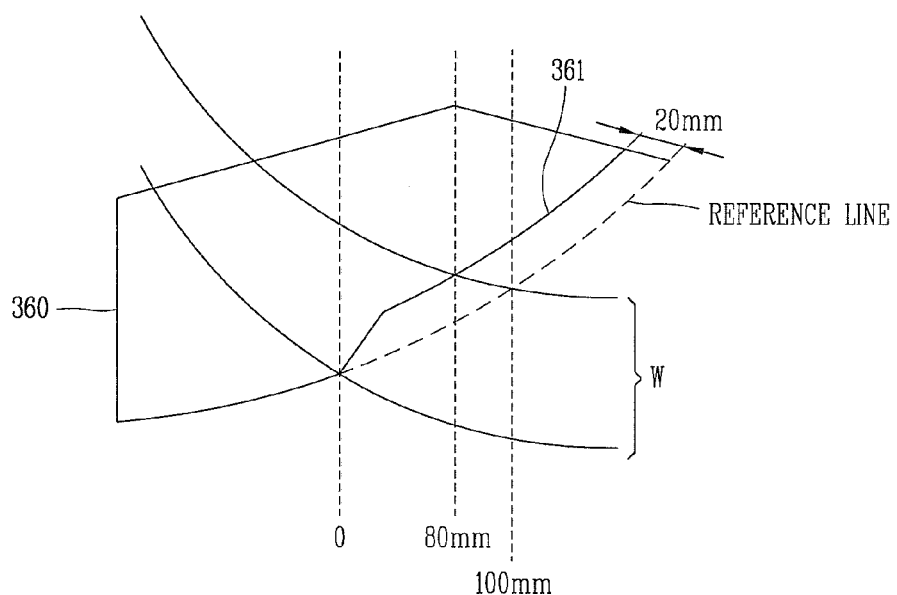
FIGS. 14A and 14B are schematic cross-sectional views of a blade structure in the divisional exposure apparatus according to the third exemplary aspect present disclosure.
Figure 14B:
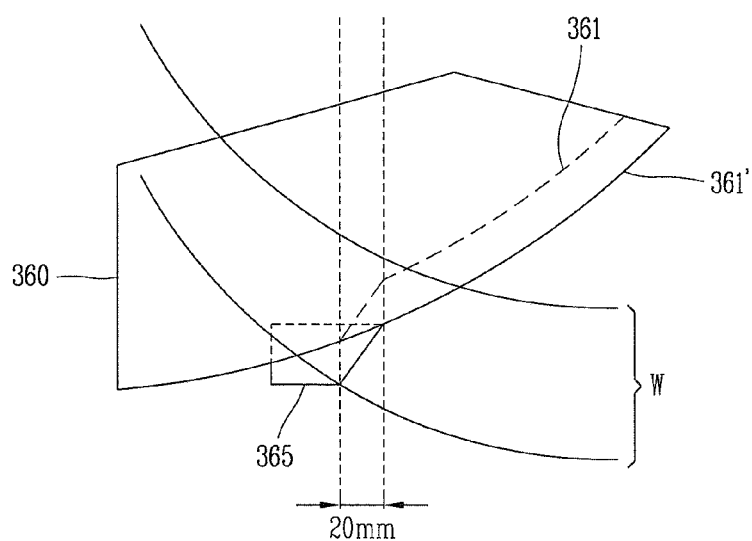

FIGS. 14A and 14B are schematic cross-sectional views of a blade structure in the divisional exposure apparatus according to the third exemplary aspect present disclosure, which depict a blade installed on one side of a light illumination pattern W by way of example.

Referring to FIG. 14A, a blade 360 according to the third exemplary aspect of the present disclosure has a certain curvature at an edge portion that blocks the light illumination pattern W, in order to control exposure energy falling on an overlap region where scans overlap, according to position. That is, the blade 360 has a bottom edge 361 that crosses the light illumination pattern W obliquely. The bottom edge 361 has a certain curvature, and the part where the light illumination pattern W and the bottom edge 361 meet constitutes an exposure energy overlap region.

For convenience of explanation, FIG. 14A illustrates the curvature of the edge portion of the blade indicated by a reference line, in the divisional exposure apparatus according to the first exemplary aspect of the present disclosure.

In this case, in the divisional exposure apparatus according to the first exemplary aspect of the present disclosure, the overlap region maintains an overlap exposure width of 100 mm at every position, with 0 mm at a point where the light illumination pattern W and the bottom edge 361 meets.

On the contrary, in the divisional exposure apparatus according to the third exemplary aspect of the present disclosure, the overlap region may vary according to position, and it can be seen that, in the second region, the bottom edge 361 of the blade 360 is cut about 20 mm upward from the reference line while having substantially the same curvature as the reference line.

In the first region, the bottom edge 361 is cut at a steep angle towards the upward-cut, second region from the point 0 where the light illumination pattern W and the bottom edge 361 meet. The first region has a width of about 20 mm, and corresponds to the edge of the overlap region in an illumination intensity graph.

As described previously, the blade 360 according to the present disclosure may be modified in shape to be optimized to a specific model, but in order to cope with a variety of models, it should be altered into different shapes optimized for different models.

To solve this problem, referring to FIG. 14B, the divisional exposure apparatus according to the third exemplary aspect of the present disclosure may comprise a bottom edge 361' corresponding to the reference line, and may further comprise an auxiliary blade 365 in the first region, corresponding to the part that is steeply cut towards the bottom edge 361 of the second region shown in FIG. 14A.

In this case, the bottom edge 361' of the blade 360 matches the reference line in the divisional exposure apparatus according to the first exemplary aspect of the present disclosure, and the auxiliary blade 365 is installed in the first region. That is, the first region, where the auxiliary blade 365 is sloped, that corresponds to the edge of the overlap region may have a width of 20 mm.

While a description has been given so far of an overlap region with a width of 80 mm by way of example, the present disclosure is not limited to it. An example in which the overlap region has a width of 100 mm will be described in detail through a fourth exemplary aspect of the present disclosure.

Figure 15A:
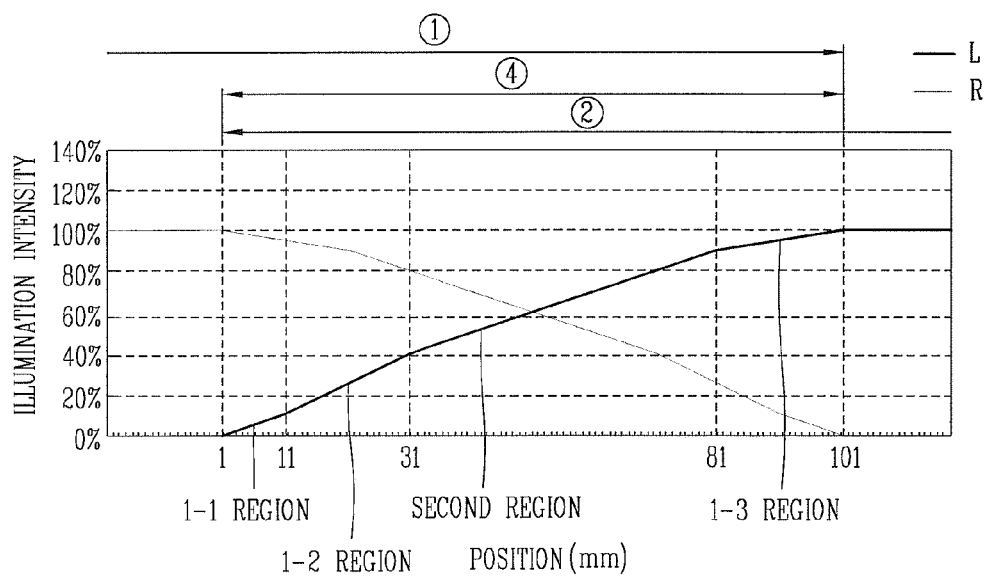
FIGS. 15A and 15B are graphs of illumination intensities and the sum of the illumination intensities in each region, in a divisional exposure method according to a fourth exemplary aspect of the present disclosure.
Figure 15B:
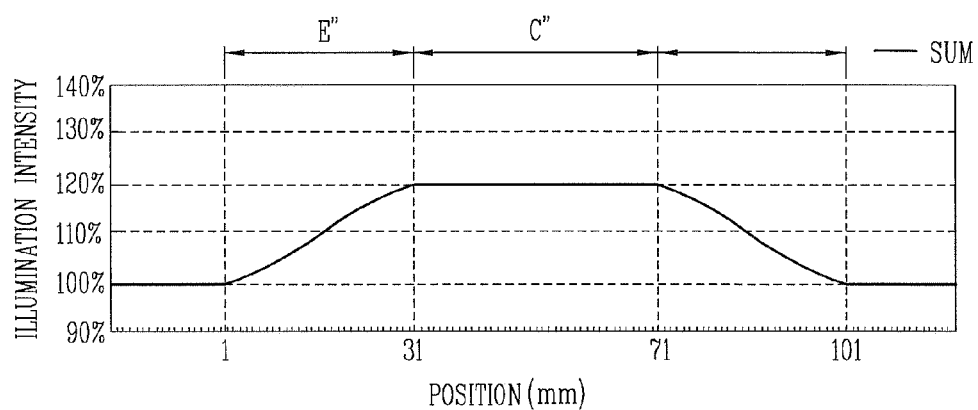

FIGS. 15A and 15B are graphs of illumination intensities and the sum of the illumination intensities in each region, in a divisional exposure method according to a fourth exemplary aspect of the present disclosure.

FIG. 15A shows the illumination intensities (L and R) of Scan 1 and Scan 2 according to position, and FIG. 15B shows the sum of the illumination intensities (L and R) of Scan 1 and Scan 2 according to position.

The divisional exposure method according to the third exemplary aspect of the present disclosure, depicted in FIGS. 15A and 15B, will be described with an example in which the illumination intensity profile of each scan in the overlap region, i.e., the fourth exposure part ④, is finely controlled for at least four regions, i.e., 1-1, 1-2, 1-3, and second regions. The width of the overlap region is set to 100 m, and the width of the 1-1, 1-2, 1-3, and second regions are set to 10 mm, 20 mm, 20 mm, and 50 mm, respectively, but the present disclosure is not limited to this.

The divisional exposure method according to the fourth exemplary aspect of the present disclosure is characterized in that the 1-1, 1-2, 1-3, and second regions are linear with different slopes, and the overlap region is wider compared to the divisional exposure methods according to the second and third exemplary aspects of the present disclosure.

FIG. 16 is a table showing, by way of example, illumination intensities (L and R) of Scan 1 and Scan 2 and the sum of the illumination intensities according to position in the overlap region, in the divisional exposure method according to the fourth exemplary aspect of the present disclosure.

FIGS. 15A, 15B, and 16 are giving an example in which the illumination intensity L of Scan 1 increases from 0% to 100% when the position moves from 1 mm to 101 mm from one end of the overlap region, i.e., fourth exposure part ④, but this is merely for the convenience of explanation and the present disclosure is not limited to it.

Referring to FIGS. 15A and 15B, in the fourth exemplary aspect of the present disclosure, in the case of the first exposure part ①, second exposure part ②, and third exposure part ③ formed by Scan 1 and Scan 2, for example, the total amount of energy in the fourth exposure part ④, an overlap region, supplied by Scan 1 and Scan 2 may be set larger than the amount of energy in each of the non-overlap regions of the first and second exposure parts ① and ②.

It can be seen that, if the sum of the illumination intensities at the left and right of the center C" of the overlap region is increased from 100% to 120%, the number of black spots at the center C" of the overlap region is reduced to 1~2 from 7~8 in the related art. In this case, it is revealed that, when the position moves in increments of 1 mm in the range of 31 mm to 71 mm, the illumination intensity L of Scan 1 increases from 40% to 80% in increments of 1% while the illumination intensity R of Scan 2 decreases from 80% to 40% in decrements of 1%. Thus, it can be concluded that the sum of the illumination intensities at the center C" of the overlap region is uniform 120%.

Moreover, in the fourth exemplary aspect of the present disclosure, it can be seen that the illumination intensity profile used for the edge E" of the overlap region is different from that used for the center C" of the overlap region, in order to prevent white spots at the edge E" of the overlap region. Especially in the fourth exemplary aspect of the present disclosure, different light illumination profiles are used for the 1-1, 1-2, and 1-3 regions That is, the illumination intensity L of Scan 1 increases from 0.0% to 10.0% in increments of 1.0% when the position moves in increments of 1 mm in the range of 1 mm to 11 mm in the 1-1 region, and increases from 10.0% to 40.0% in increments of 1.5% when the position moves in increments of 1 mm in the range of 11 mm to 31 mm in the 1-2 region. Also, the illumination intensity L of Scan 1 increases from 40.0% to 90.0% in increments of 1.0% when the position moves in increments of 1 mm in the range of 31 mm to 81 mm in the second region, and increases from 90.0% to 100% in increments of 0.5% when the position moves in increments of 1 mm in the range of 81 mm to 101 mm in the 1-3 region.

On the other hand, the illumination intensity R of Scan 2 is a symmetrical reflection of the illumination intensity L of Scan 1. That is, the illumination intensity R of Scan 2 decreases from 100.0% to 90.0% in decrements of 0.5% when the position moves in increments of 1 mm in the range of 1 mm to 21 mm, and decreases from 90.0% to 40.0% in decrements of 1.0% when the position moves in increments of 1 mm in the range of 21 mm to 71 mm. Also, the illumination intensity R of Scan 2 decreases from 40.0% to 10.0% in decrements of 1.5% when the position moves in increments of 1 mm in the range of 71 mm to 91 mm, and decreases from 10.0% to 0.0% in decrements of 1.0% when the position moves in increments of 1 mm in the range of 91 mm to 101 mm.

Thus, it can be concluded that the sum of the illumination intensities at the edge E" of the overlap region increases from 100% to 120%, in a similar shape to a 3-point curve with a point of inflection.

Figure 17A:
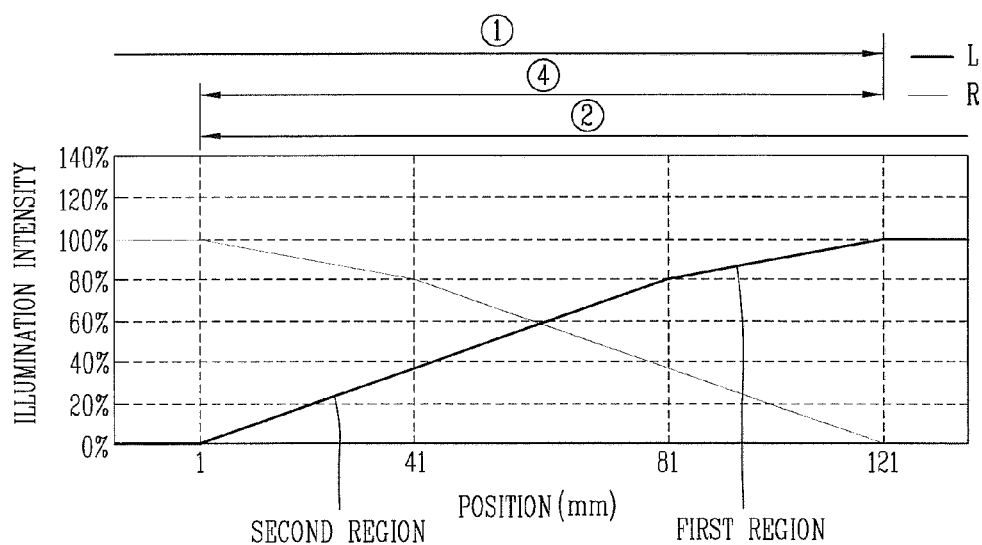
FIGS. 17A and 17B are graphs of illumination intensities and the sum of the illumination intensities in each region, in a divisional exposure method according to a fifth exemplary aspect of the present disclosure.
Figure 17B:
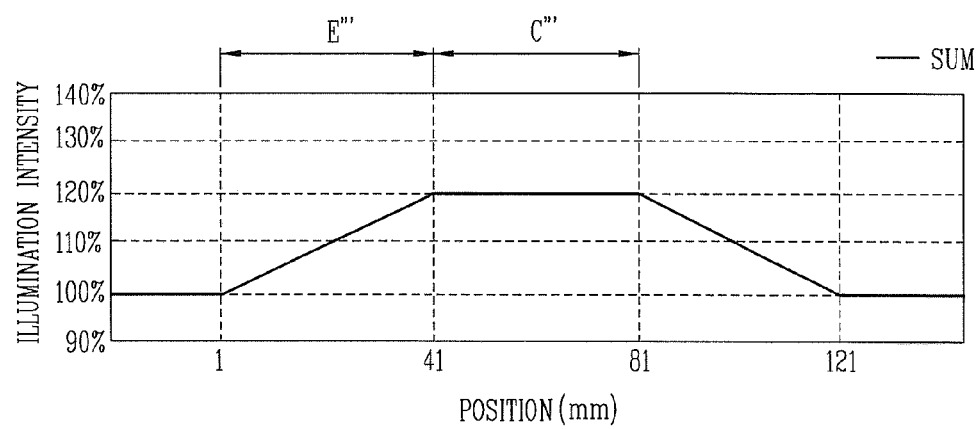

FIGS. 17A and 17B are graphs of illumination intensities and the sum of the illumination intensities in each region, in a divisional exposure method according to a fifth exemplary aspect of the present disclosure.

FIG. 17A shows the illumination intensities (L and R) of Scan 1 and Scan 2 according to position, and FIG. 17B shows the sum of the illumination intensities (L and R) of Scan 1 and Scan 2 according to position.

The divisional exposure method according to the fifth exemplary aspect of the present disclosure, depicted in FIGS. 17A and 17B, will be described with an example in which the illumination intensity profile of each scan in the overlap region, i.e., the fourth exposure part ④, is finely controlled for at least two regions, i.e., first and second regions. The width of the overlap region is set to 120 m, the width of the first region is set to 40 mm, and the width of the second region is set to 80 mm, but the present disclosure is not limited to this.

The divisional exposure method according to the fifth exemplary aspect of the present disclosure is characterized in that, for the illumination intensity L of Scan 1, the first region comes after the second region, and the overlap region is wider compared to the divisional exposure methods according to the second, third, and fourth exemplary aspects of the present disclosure.

FIG. 18 is a table showing, by way of example, illumination intensities (L and R) of Scan 1 and Scan 2 and the sum of the illumination intensities according to position in the overlap region, in the divisional exposure method according to the fifth exemplary aspect of the present disclosure.

FIGS. 17A, 17B, and 18 are giving an example in which the illumination intensity L of Scan 1 increases from 0% to 100% when the position moves from 1 mm to 121 mm from one end of the overlap region, i.e., fourth exposure part ④, but this is merely for the convenience of explanation and the present disclosure is not limited to it.

Referring to FIGS. 17A and 17B, in the fifth exemplary aspect of the present disclosure, in the case of the first exposure part ①, second exposure part ②, and third exposure part ③ formed by Scan 1 and Scan 2, for example, the total amount of energy in the fourth exposure part ④, an overlap region, supplied by Scan 1 and Scan 2 may be set larger than the amount of energy in each of the non-overlap regions of the first and second exposure parts ① and ②.

It can be seen that, if the sum of the illumination intensities at the left and right of the center C''' of the overlap region is increased from 100% to 120%, the number of black spots at the center C''' of the overlap region is reduced. In this case, it is revealed that, when the position moves in increments of 1 mm in the range of 41 mm to 81 mm, the illumination intensity L of Scan 1 increases from 40% to 80% in increments of 1% while the illumination intensity R of Scan 2 decreases from 80% to 40% in decrements of 1%. Thus, it can be concluded that the sum of the illumination intensities at the center C''' of the overlap region is uniform 120%.

Moreover, in the fifth exemplary aspect of the present disclosure, it can be seen that the illumination intensity profile used for the edge E''' of the overlap region is different from that used for the center C''' of the overlap region, in order to prevent white spots at the edge E''' of the overlap region.

That is, referring to FIG. 18, when the position moves in increments of 1 mm in the range of 1 mm to 41 mm, the illumination intensity L of Scan 1 increases from 0.0% to 40.0% in increments of 1.0% while the illumination intensity R of Scan 2 decreases from 100.0% to 80.0% in decrements of 0.5%. Also, when the position moves in increments of 1 mm in the range of 41 mm to 81 mm, the illumination intensity L of Scan 1 increases from 40.0% to 80.0% in increments of 1% while the illumination intensity R of Scan 2 decreases from 80% to 40.0% in decrements of 1%. Also, when the position moves in increments of 1 mm in the range of 81 mm to 121 mm, the illumination intensity L of Scan 1 increases from 80.0% to 100.0% in increments of 0.5% while the illumination intensity R of Scan 2 decreases from 40.0% to 0.0% in decrements of 1.0%.

Thus, it can be concluded that the sum of the illumination intensities at the edge E''' of the overlap region linearly increases from 100% to 120% or linearly decreases from 120% to 100%.

In this way, by dividing the overlap region into at least two regions, i.e., first and second regions, to use different illumination intensity profiles for these regions in each scan and configuring the illumination intensity profiles such that the rate of increase in illumination intensity in the first region is lower than that in the second region, white spots at the edge E''' of the overlap region may be prevented. That is, the illumination intensity profiles may be configured in such a way that the sum of the illumination intensities at the center C''' of the overlap region is maintained constant at 120% and the sum of the illumination intensities at the edge E''' of the overlap region increases smoothly.

Figure 19A:
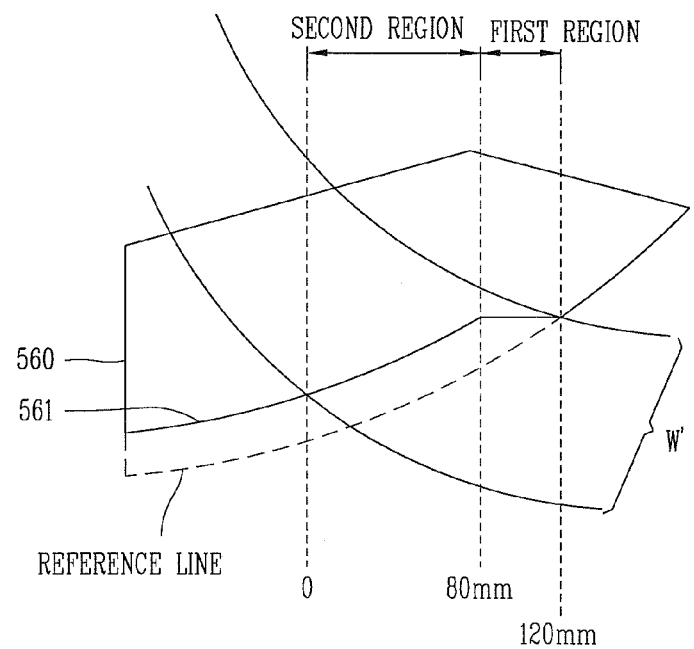
FIGS. 19A and 19B are schematic plan views of a blade structure in the divisional exposure apparatus according to the fifth exemplary aspect of the present disclosure.
Figure 19B:
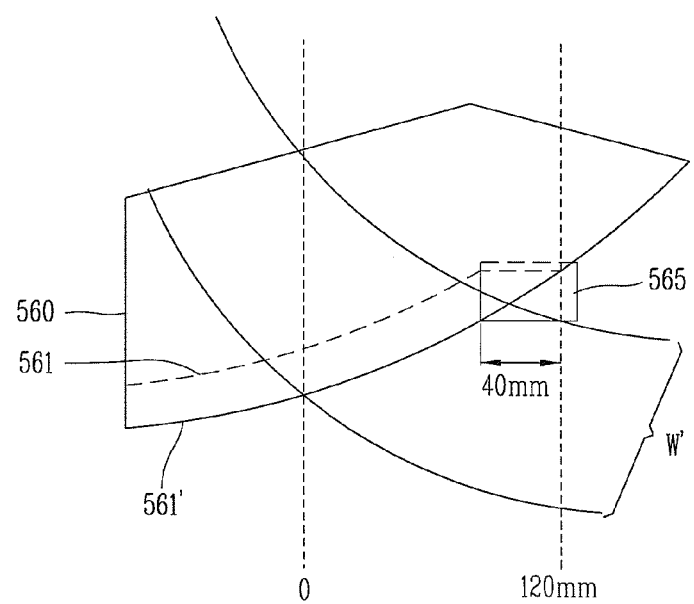

FIGS. 19A and 19B are schematic plan views of a blade structure in the divisional exposure apparatus according to the fifth exemplary aspect of the present disclosure, which depict a blade installed on one side of a light illumination pattern W' by way of example.

Referring to FIG. 19A, a blade 560 according to the fifth exemplary aspect of the present disclosure has a certain curvature at an edge portion that blocks the light illumination pattern W', in order to control exposure energy falling on an overlap region where scans overlap, according to position. That is, the blade 560 has a bottom edge 561 that crosses the light illumination pattern W' obliquely. The bottom edge 561 has a certain curvature, and the part where the light illumination pattern W' and the bottom edge 561 meet constitutes an exposure energy overlap region.

For convenience of explanation, FIG. 19A illustrates the curvature of the edge portion of the blade indicated by a reference line, in the divisional exposure apparatus according to the first exemplary aspect of the present disclosure.

In this case, in the divisional exposure apparatus according to the fifth exemplary aspect of the present disclosure, the overlap region may vary according to position, with 0 mm at a point where the light illumination pattern W' and the bottom edge 561 meets, and it can be seen that, in the second region, the bottom edge 561 of the blade 560 is cut upward from the reference line while having substantially the same curvature as the reference line.

In the first region, the bottom edge 561 is cut at a steep angle towards the second region from another point where the light illumination pattern W' and the bottom edge 561 meets. The first region has a width of about 40 mm, and corresponds to the edge of the overlap region in an illumination intensity graph.

In this way, it can be seen that the blade 560 according to the fifth exemplary aspect of the present disclosure is cut at a different position from the blades according to the foregoing second, third, and fourth exemplary aspects of the present disclosure, and that the blade 560 is cut from the front, i.e., in the opposite direction to that in the second, third, and fourth exemplary aspects of the present disclosure. This is a way to design an overlap width greater than 100 mm, and the rate of increase in illumination intensity in the first region may be made more smooth by increasing the overlap width, which can be more effective in preventing spots.

As described previously, the blade 560 according to the present disclosure may be modified in shape to be optimized to a specific model, but in order to cope with a variety of models, it should be altered into different shapes optimized for different models.

To solve this problem, referring to FIG. 19B, the divisional exposure apparatus according to the second exemplary aspect of the present disclosure may comprise a bottom edge 561' corresponding to the reference line, and may further comprise an auxiliary blade 565 in the first region, corresponding to the part that is steeply cut towards the bottom edge 561 of the second region shown in FIG. 19A.

In this case, the bottom edge 561' of the blade 560 matches the reference line in the divisional exposure apparatus according to the first exemplary aspect of the present disclosure, and the auxiliary blade 565 is installed in the first region. That is, the first region, where the auxiliary blade 565 is sloped, that corresponds to the edge of the overlap region may have a width of 40 mm.

Although the description herein contains many specific examples and descriptions, these should not be construed as limiting the scope of the disclosure but as merely providing illustrations of some of the aspects of the disclosure. Thus, the scope of the disclosure should be determined by the appended claims and their equivalents, rather than by the examples given.

What is claimed is:

1. A divisional exposure apparatus for exposing a substrate to light in a divided fashion by emitting the light in a light illumination pattern by multiple scans, the divisional exposure apparatus comprising a blade having a bottom edge obliquely crossing the light illumination pattern that is located at one side of the light illumination pattern in an overlap region where scans overlap and that controls a light exposure energy or an illumination intensity depending on a position of the illuminated light,
   wherein the overlap region is divided into at least first and second regions, on which the light illuminates, the first and second regions having different rates of increase in the illumination intensity, and minimum and maximum illumination intensities of a non-overlap region are 0% and 100%, respectively.

2. The divisional exposure apparatus of claim 1, wherein an edge of the overlap region is controlled to have one of the illumination intensities being 100% and the other illumination intensity being 0%.

3. The divisional exposure apparatus of claim 1, wherein the blade has a curvature at the bottom edge to block the light illumination pattern.

4. The divisional exposure apparatus of claim 3, wherein a part where the light illumination pattern and the bottom edge meets constitutes the overlap region.

5. The divisional exposure apparatus of claim 3, wherein, in the second region, the bottom edge of the blade is cut upward, and in the first region, the bottom edge is cut at an angle towards the second region from a point where the light illumination pattern and the bottom edge meet.

6. The divisional exposure apparatus of claim 3, further comprising an auxiliary blade, corresponding to the part that is obliquely cut towards the second region.

7. The divisional exposure apparatus of claim 6, wherein the auxiliary blade is installed in the first region.

8. The divisional exposure apparatus of claim 3, wherein a sum of the illumination intensities at a center of the overlap region is constant, and when the position moves by increments of 1 mm, the illumination intensity of Scan 1 increases by increments of 1% while the illumination intensity of Scan 2 which overlaps Scan 1 decreases by increments of 1%.

9. The divisional exposure apparatus of claim 8, wherein, at the edge of the overlap region, when the position moves by increments of 3 mm, the illumination intensity of Scan 1 increases by increments of 1% while the illumination intensity of Scan 2 decreases by increments of 1%.

10. The divisional exposure apparatus of claim 8, wherein the illumination intensity of Scan 1 increases from 0.0% to 2.0% by increments of 1.0% when the position moves by increments of 1 mm in the range of 1 mm to 3 mm, increases from 2.0% to 3.5% by an increment of 1.5% when the position moves in the range of 3 mm to 4 mm, increases from 3.5% to 15.5% by increments of 2.0% when the position moves by increments of 1 mm in the range of 4 mm to 10 mm, increases from 15.5% to 20.5% by increments of 2.5% when the position moves by increments of 1 mm in the range of 10 mm to 12 mm, increases from 20.5% to 23.5% by an increment of 3.0% when the position moves in the range of 12 mm to 13 mm, and increases from 23.5% to 28.5% by increments of 2.5% when the position moves by increments of 1 mm in the range of 13 mm to 15 mm, increases from 28.5% to 38.5% by increments of 2.0% when the position moves by increments of 1 mm in the range of 15 mm to 20 mm, and increases from 38.5% to 40.0% by increments of 1.5% when the position moves in the range of 20 mm to 21 mm.

11. The divisional exposure apparatus of claim 10, wherein the illumination intensity of Scan 2 decreases from 100.0% to 80.0% by decrements of 1.0% when the position moves by increments of 1 mm in the range of 1 mm to 21 mm.

12. The divisional exposure apparatus of claim 1, wherein a sum of the illumination intensities at an edge of the overlap region has a linear shape or a shape of a cubic polynomial curve having an inflection point, in the range of 100% to 120%.

13. The divisional exposure apparatus of claim 1, wherein the overlap region is divided into a 1-1 region, a 1-2 region, a 1-3 region, and a second region for different illumination intensities of different scans, and the 1-1, 1-2, 1-3, and second regions are linear with different slopes.

14. The divisional exposure apparatus of claim 13, wherein the illumination intensity of Scan 1 increases from 0.0% to 10.0% by increments of 1.0% when the position moves by increments of 1 mm in the range of 1 mm to 11 mm in the 1-1 region, increases from 10.0% to 40.0% by increments of 1.5% when the position moves by increments of 1 mm in the range of 11 mm to 31 mm in the 1-2 region, increases from 40.0% to 90.0% by increments of 1.0% when the position moves by increments of 1 mm in the range of 31 mm to 81 mm in the second region, and increases from 90.0% to 100.0% in increments of 0.5% when the position moves by increments of 1 mm in the range of 81 mm to 101 mm in the 1-3 region.

15. The divisional exposure apparatus of claim 14, wherein the illumination intensity of Scan 2 decreases from 100.0% to 90.0% by decrements of 0.5% when the position moves by increments of 1 mm in the range of 1 mm to 21 mm, decreases from 90.0% to 40.0% by decrements of 1.0% when the position moves by increments of 1 mm in the range of 21 mm to 71 mm, decreases from 40.0% to 10.0% by decrements of 1.5% when the position moves by increments of 1 mm in the range of 71 mm to 91 mm, and decreases from 10.0% to 0.0% by decrements of 1.0% when the position moves by increments of 1 mm in the range of 91 mm to 101 mm.

16. The divisional exposure apparatus of claim 1, wherein, when the position moves by increments of 1 mm in the range of 1 mm to 41 mm, the illumination intensity of Scan 1 increases from 0.0% to 40.0% by increments of 1.0% while the illumination intensity of Scan 2 decreases from 100.0% to 80.0% by decrements of 0.5%, when the position moves by increments of 1 mm in the range of 41 mm to 81 mm, the illumination intensity of Scan 1 increases from 40.0% to 80.0% by increments of 1% while the illumination intensity of Scan 2 decreases from 80% to 40.0% by decrements of 1%, and when the position moves by increments of 1 mm in the range of 81 mm to 121 mm, the illumination intensity of Scan 1 increases from 80.0% to 100.0% by increments of 0.5% while the illumination intensity of Scan 2 decreases from 40.0% to 0.0% by decrements of 1.0%.

17. A divisional exposure apparatus for exposing a substrate to light in a divided fashion by emitting light in a light illumination pattern by multiple scans, the divisional exposure apparatus comprising a blade having a bottom edge obliquely crossing the light illumination pattern that is located at one side of the light illumination pattern in an overlap region where scans overlap and that controls a light exposure energy or an illumination intensity depending on a position of the illuminated light,
wherein the blade serves to control a sum of the illumination intensities at a center of the overlap region in the range of 120% to 130%, where minimum and maximum illumination intensities of a non-overlap region are 0% and 100%, respectively.

18. The divisional exposure apparatus of claim 17, wherein the light exposure energy for the edge of the overlap region is controlled to have one of the illumination intensities being 100% and the other illumination intensity being 0%.

19. The divisional exposure apparatus of claim 18, wherein the overlap region is divided into at least first and second regions, on which light illuminates, the first and second regions having different rates of increase in illumination intensity.

* * * * *